(12) United States Patent
Pradhan et al.

(10) Patent No.: US 10,663,830 B2
(45) Date of Patent: *May 26, 2020

(54) FABRICATION OF LOW DEFECTIVITY ELECTROCHROMIC DEVICES

(71) Applicant: View, Inc., Milpitas, CA (US)

(72) Inventors: Anshu A. Pradhan, Collierville, TN (US); Robert T. Rozbicki, Los Gatos, CA (US); Dane Gillaspie, Fremont, CA (US); Sridhar K. Kailasam, Fremont, CA (US)

(73) Assignee: View, Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/284,876

(22) Filed: Feb. 25, 2019

(65) Prior Publication Data

US 2019/0187531 A1   Jun. 20, 2019

Related U.S. Application Data

(63) Continuation of application No. 15/340,853, filed on Nov. 1, 2016, now Pat. No. 10,261,381, which is a
(Continued)

(51) Int. Cl.
*G02F 1/03* (2006.01)
*G02F 1/15* (2019.01)
(Continued)

(52) U.S. Cl.
CPC ........ *G02F 1/1523* (2013.01); *C03C 17/3417* (2013.01); *C23C 10/28* (2013.01);
(Continued)

(58) Field of Classification Search
CPC .......... G02F 1/167; G02F 1/0316; G02F 3/16; G02F 1/163; G02F 1/155; G02F 1/1523;
(Continued)

(56) References Cited

U.S. PATENT DOCUMENTS 3,971,624 A   7/1976   Bruesch et al.
4,009,935 A   3/1977   Faughnan et al.
(Continued)

FOREIGN PATENT DOCUMENTS

CN   1207182 A   2/1999
CN   1245540 A   2/2000
(Continued)

OTHER PUBLICATIONS

Preliminary Amendment filed Aug. 3, 2018 in U.S. Appl. No. 15/916,142.
(Continued)

*Primary Examiner* — Dawayne Pinkney
(74) *Attorney, Agent, or Firm* — Weaver Austin Villeneuve & Sampson LLP; Brian D. Griedel

(57) ABSTRACT

Prior electrochromic devices frequently suffer from high levels of defectivity. The defects may be manifest as pin holes or spots where the electrochromic transition is impaired. This is unacceptable for many applications such as electrochromic architectural glass. Improved electrochromic devices with low defectivity can be fabricated by depositing certain layered components of the electrochromic device in a single integrated deposition system. While these layers are being deposited and/or treated on a substrate, for example a glass window, the substrate never leaves a controlled ambient environment, for example a low pressure controlled atmosphere having very low levels of particles. These layers may be deposited using physical vapor deposition. In certain embodiments, the device includes a counter electrode having an anodically coloring electrochromic material in combination with an additive.

27 Claims, 17 Drawing Sheets

Related U.S. Application Data continuation-in-part of application No. PCT/US2015/028067, filed on Apr. 28, 2015.

(60) Provisional application No. 61/988,111, filed on May 2, 2014.

(51) Int. Cl.

| | |
|---|---|
| *G02F 1/133* | (2006.01) |
| *G09G 3/38* | (2006.01) |
| *G02F 1/1523* | (2019.01) |
| *C03C 17/34* | (2006.01) |
| *C23C 10/28* | (2006.01) |
| *C23C 14/08* | (2006.01) |
| *C23C 14/18* | (2006.01) |
| *C23C 14/56* | (2006.01) |
| *C23C 14/58* | (2006.01) |

(52) U.S. Cl.
CPC ............ *C23C 14/08* (2013.01); *C23C 14/083* (2013.01); *C23C 14/185* (2013.01); *C23C 14/568* (2013.01); *C23C 14/5806* (2013.01); *C23C 14/5853* (2013.01); *C03C 2217/94* (2013.01)

(58) Field of Classification Search
CPC ........ G02F 1/1521; G02F 1/133; G02F 1/061; G02F 2001/1678; G02F 1/1533; G02F 1/03; G02B 26/00; G02B 26/08; G02B 26/26; C09K 9/02; B60R 1/088; H04N 9/3137; H04N 9/22
USPC ........ 359/296, 253–254, 245–247, 290–291, 359/298, 265–275, 277, 242; 349/33; 345/49, 105, 107; 430/31–32
See application file for complete search history.

(56) References Cited

U.S. PATENT DOCUMENTS

| | | |
|---|---|---|
| 4,264,150 A | 4/1981 | Yano et al. |
| 4,293,194 A | 10/1981 | Takahashi |
| 4,297,006 A | 10/1981 | Bissar |
| 4,396,253 A | 8/1983 | Kuwagaki et al. |
| 4,482,216 A | 11/1984 | Hashimoto |
| 4,561,729 A | 12/1985 | Heinz et al. |
| 4,832,463 A | 5/1989 | Goldner et al. |
| 4,851,095 A | 7/1989 | Scobey et al. |
| 4,923,289 A | 5/1990 | Demiryont |
| 4,938,571 A | 7/1990 | Cogan et al. |
| 5,019,420 A | 5/1991 | Rauh |
| 5,124,832 A | 6/1992 | Greenberg et al. |
| 5,138,481 A | 8/1992 | Demiryont |
| 5,142,406 A | 8/1992 | Lampert et al. |
| 5,209,980 A | 5/1993 | Spindler |
| 5,216,536 A | 6/1993 | Agrawal et al. |
| 5,657,150 A | 8/1997 | Kallman et al. |
| 5,659,417 A | 8/1997 | Van Dine et al. |
| 5,666,771 A | 9/1997 | Macquart et al. |
| 5,699,192 A | 12/1997 | Van Dine et al. |
| 5,724,175 A | 3/1998 | Hichwa et al. |
| 5,724,177 A | 3/1998 | Ellis, Jr. et al. |
| 5,754,329 A | 5/1998 | Coleman |
| 5,757,537 A | 5/1998 | Ellis, Jr. et al. |
| 5,814,195 A | 9/1998 | Lehan et al. |
| 5,831,760 A | 11/1998 | Hashimoto et al. |
| 5,847,858 A | 12/1998 | Krings et al. |
| 5,859,723 A | 1/1999 | Jodicke et al. |
| 5,910,854 A | 6/1999 | Varaprasad |
| 6,020,987 A | 2/2000 | Baumann et al. |
| 6,178,034 B1 | 1/2001 | Allemand |
| 6,185,034 B1 | 2/2001 | Nakamura et al. |
| 6,211,995 B1 | 4/2001 | Azens et al. |
| 6,266,177 B1 | 7/2001 | Allemand et al. |
| 6,277,523 B1 | 8/2001 | Giron |
| 6,337,758 B1 | 1/2002 | Beteille et al. |
| 6,515,787 B1 | 2/2003 | Westfall et al. |
| 6,529,308 B2 | 3/2003 | Beteille et al. |
| 6,559,411 B2 | 5/2003 | Borgeson et al. |
| 6,791,737 B2 | 9/2004 | Giron |
| 6,791,738 B2 | 9/2004 | Reynolds et al. |
| 6,822,778 B2 | 11/2004 | Westfall et al. |
| 6,856,444 B2 | 2/2005 | Ingalls et al. |
| 6,859,297 B2 | 2/2005 | Lee et al. |
| 6,919,530 B2 | 7/2005 | Borgeson et al. |
| 6,940,628 B2 | 9/2005 | Giron |
| 7,099,062 B2 | 8/2006 | Azens et al. |
| 7,193,763 B2 | 3/2007 | Beteille et al. |
| 7,230,748 B2 | 6/2007 | Giron et al. |
| 7,265,891 B1 | 9/2007 | Demiryont |
| 7,277,215 B2 | 10/2007 | Greer |
| 7,372,610 B2 | 5/2008 | Burdis et al. |
| 7,531,101 B2 | 5/2009 | Beteille |
| 7,564,611 B2 | 7/2009 | Jang et al. |
| 7,593,154 B2 | 9/2009 | Burdis et al. |
| 7,604,717 B2 | 10/2009 | Beteille et al. |
| 7,646,526 B1 | 1/2010 | Wang et al. |
| 7,704,555 B2 | 4/2010 | Demiryont |
| 7,830,585 B2 | 11/2010 | Widjaja et al. |
| 7,869,114 B2 | 1/2011 | Valentin et al. |
| 7,894,120 B2 | 2/2011 | Valentin et al. |
| 8,004,744 B2 | 8/2011 | Burdis et al. |
| 8,031,389 B2 | 10/2011 | Wang et al. |
| 8,168,265 B2 | 5/2012 | Kwak et al. |
| 8,228,592 B2 | 7/2012 | Wang et al. |
| 8,300,298 B2 | 10/2012 | Wang et al. |
| 8,432,603 B2 | 4/2013 | Wang et al. |
| 8,582,193 B2 | 11/2013 | Wang et al. |
| 8,638,487 B2 | 1/2014 | Veerasamy |
| 8,687,261 B2 | 4/2014 | Gillaspie et al. |
| 8,749,868 B2 | 6/2014 | Wang et al. |
| 8,758,575 B2 | 6/2014 | Wang et al. |
| 8,764,950 B2 | 7/2014 | Wang et al. |
| 8,764,951 B2 | 7/2014 | Wang et al. |
| 8,773,747 B2 | 7/2014 | Ferreira et al. |
| 9,007,674 B2 | 4/2015 | Kailasam et al. |
| 9,116,409 B1 | 8/2015 | Sun et al. |
| 9,140,951 B2 | 9/2015 | Wang et al. |
| 9,164,346 B2 | 10/2015 | Wang et al. |
| 9,261,751 B2 | 2/2016 | Pradhan et al. |
| 9,334,557 B2 | 5/2016 | Neudecker et al. |
| 9,454,053 B2 | 9/2016 | Strong et al. |
| 9,477,129 B2 | 10/2016 | Kozlowski et al. |
| 9,664,974 B2 | 5/2017 | Kozlowski et al. |
| 9,671,664 B2 | 6/2017 | Pradhan et al. |
| 9,720,298 B2 | 8/2017 | Wang et al. |
| 9,759,975 B2 | 9/2017 | Wang et al. |
| 9,904,138 B2 | 2/2018 | Kailasam et al. |
| 10,054,833 B2 | 8/2018 | Kailasam et al. |
| 10,088,729 B2 | 10/2018 | Wang et al. |
| 10,156,762 B2 | 12/2018 | Gillaspie et al. |
| 10,185,197 B2 | 1/2019 | Pradhan et al. |
| 10,228,601 B2 | 3/2019 | Gillaspie et al. |
| 10,254,615 B2 | 4/2019 | Kailasam et al. |
| 10,261,381 B2 | 4/2019 | Pradhan et al. |
| 10,345,671 B2 | 7/2019 | Gillaspie et al. |
| 2003/0010957 A1 | 1/2003 | Haering et al. |
| 2003/0156313 A1 | 8/2003 | Serra et al. |
| 2004/0150867 A1 | 8/2004 | Lee et al. |
| 2005/0147825 A1 | 7/2005 | Arnaud et al. |
| 2005/0259310 A1 | 11/2005 | Giri et al. |
| 2006/0209383 A1 | 9/2006 | Burdis et al. |
| 2007/0008605 A1 | 1/2007 | Garg et al. |
| 2007/0097481 A1 | 5/2007 | Burdis et al. |
| 2007/0292606 A1 | 12/2007 | Demiryont |
| 2008/0304130 A1 | 12/2008 | Nguyen |
| 2008/0304131 A1 | 12/2008 | Nguyen |
| 2009/0057137 A1 | 3/2009 | Pitts et al. |
| 2009/0285978 A1 | 11/2009 | Burdis et al. |
| 2009/0304912 A1 | 12/2009 | Kwak et al. |
| 2009/0323156 A1 | 12/2009 | Shin et al. |
| 2009/0323158 A1 | 12/2009 | Wang et al. |
| 2010/0007937 A1 | 1/2010 | Widjaja et al. |

(56) References Cited

U.S. PATENT DOCUMENTS

| | | |
|---|---|---|
| 2010/0103496 A1 | 4/2010 | Schwendeman et al. |
| 2010/0165440 A1 | 7/2010 | Nguyen et al. |
| 2010/0243427 A1 | 9/2010 | Kozlowski et al. |
| 2010/0245973 A1 | 9/2010 | Wang et al. |
| 2011/0043885 A1 | 2/2011 | Lamine et al. |
| 2011/0043886 A1 | 2/2011 | Jeon et al. |
| 2011/0151283 A1 | 6/2011 | Gillaspie et al. |
| 2011/0211247 A1 | 9/2011 | Kozlowski et al. |
| 2011/0249314 A1 | 10/2011 | Wang et al. |
| 2011/0266137 A1 | 11/2011 | Wang et al. |
| 2011/0266138 A1 | 11/2011 | Wang et al. |
| 2011/0267674 A1 | 11/2011 | Wang et al. |
| 2011/0267675 A1 | 11/2011 | Wang et al. |
| 2011/0297535 A1 | 12/2011 | Higdon et al. |
| 2011/0299149 A1 | 12/2011 | Park et al. |
| 2012/0181167 A1 | 7/2012 | Jiang et al. |
| 2012/0200908 A1 | 8/2012 | Bergh et al. |
| 2012/0275008 A1 | 11/2012 | Pradhan et al. |
| 2012/0276734 A1 | 11/2012 | van Mol et al. |
| 2013/0003157 A1 | 1/2013 | Wang et al. |
| 2013/0016417 A1 | 1/2013 | Veerasamy |
| 2013/0101751 A1 | 4/2013 | Berland et al. |
| 2013/0182307 A1 | 7/2013 | Gillaspie et al. |
| 2013/0270105 A1 | 10/2013 | Wang et al. |
| 2013/0286459 A1 | 10/2013 | Burdis et al. |
| 2014/0177027 A1 | 6/2014 | Wang et al. |
| 2014/0204444 A1 | 7/2014 | Choi et al. |
| 2014/0204445 A1 | 7/2014 | Choi et al. |
| 2014/0204446 A1 | 7/2014 | Choi et al. |
| 2014/0204447 A1 | 7/2014 | Choi et al. |
| 2014/0204448 A1 | 7/2014 | Bergh et al. |
| 2014/0205746 A1 | 7/2014 | Choi et al. |
| 2014/0205748 A1 | 7/2014 | Choi et al. |
| 2014/0313561 A1 | 10/2014 | Wang et al. |
| 2015/0131140 A1 | 5/2015 | Kailasam et al. |
| 2015/0362763 A1 | 12/2015 | Wheeler et al. |
| 2015/0370139 A1 | 12/2015 | Wang et al. |
| 2016/0011480 A1 | 1/2016 | Pradhan et al. |
| 2016/0026055 A1 | 1/2016 | Choi et al. |
| 2016/0209722 A1 | 7/2016 | Wang et al. |
| 2017/0003564 A1 | 1/2017 | Gillaspie et al. |
| 2017/0097552 A1 | 4/2017 | Pradhan et al. |
| 2017/0176832 A1 | 6/2017 | Pradhan et al. |
| 2017/0184937 A1 | 6/2017 | Wang et al. |
| 2017/0255076 A1 | 9/2017 | Gillaspie et al. |
| 2017/0299933 A1 | 10/2017 | Kailasam et al. |
| 2017/0329200 A1 | 11/2017 | Wang et al. |
| 2017/0357135 A1 | 12/2017 | Gillaspie et al. |
| 2017/0371221 A1 | 12/2017 | Gillaspie et al. |
| 2018/0052374 A1 | 2/2018 | Wang et al. |
| 2018/0173071 A1 | 6/2018 | Mathew et al. |
| 2018/0203320 A1 | 7/2018 | Kailasam et al. |
| 2018/0231858 A1 | 8/2018 | Kailasam et al. |
| 2019/0064623 A1 | 2/2019 | Gillaspie et al. |
| 2019/0107763 A1 | 4/2019 | Gillaspie et al. |
| 2019/0113819 A1 | 4/2019 | Pradhan et al. |
| 2019/0171078 A1 | 6/2019 | Pradhan et al. |
| 2019/0171079 A1 | 6/2019 | Gillaspie et al. |
| 2019/0187531 A1 | 6/2019 | Pradhan et al. |
| 2019/0302561 A1 | 10/2019 | Rozbicki et al. |

FOREIGN PATENT DOCUMENTS

| | | |
|---|---|---|
| CN | 1350048 A | 5/2002 |
| CN | 1492274 A | 4/2004 |
| CN | 101188886 A | 5/2005 |
| CN | 1688923 A | 10/2005 |
| CN | 1710481 A | 12/2005 |
| CN | 1738885 A | 2/2006 |
| CN | 101377599 A | 3/2009 |
| CN | 101419374 A | 4/2009 |
| CN | 101833932 A | 9/2010 |
| CN | 101930142 A | 12/2010 |
| CN | 102230172 A | 11/2011 |
| CN | 102388340 A | 3/2012 |
| CN | 102414610 A | 4/2012 |
| CN | 102455560 A | 5/2012 |
| CN | 102478739 A | 5/2012 |
| CN | 102934009 A | 2/2013 |
| CN | 102998870 A | 3/2013 |
| CN | 103135306 A | 6/2013 |
| CN | 1928685 A | 3/2017 |
| EP | 0497616 A2 | 5/1992 |
| EP | 1918412 A1 | 5/2008 |
| JP | S55-124440 U | 9/1980 |
| JP | S57-81242 A | 5/1982 |
| JP | S58-33223 A | 2/1983 |
| JP | S58-139128 A | 8/1983 |
| JP | S58-163921 A | 9/1983 |
| JP | S59-040625 A | 3/1984 |
| JP | S60-066238 A | 4/1985 |
| JP | S60-078423 A | 5/1985 |
| JP | S60-078424 A | 5/1985 |
| JP | S60-202429 A | 10/1985 |
| JP | H03-500096 A | 1/1991 |
| JP | H04-211227 A | 8/1992 |
| JP | H05-182512 A | 7/1993 |
| JP | H10-501847 A | 2/1998 |
| JP | 2004-309926 A | 11/2004 |
| JP | 2006-235632 A | 9/2006 |
| JP | 2007/108750 A | 4/2007 |
| JP | 2008-026605 A | 2/2008 |
| JP | 2008/197679 A | 8/2008 |
| JP | 2010-509720 A | 3/2010 |
| JP | 2012-523018 A | 9/2012 |
| JP | 2013-525860 A | 6/2013 |
| KR | 10-2006-0092362 | 8/2006 |
| KR | 10-2008-0051280 | 6/2008 |
| KR | 10-2014-0068026 A | 6/2014 |
| KR | 10-2010733 B1 | 8/2019 |
| KR | 10-2010755 B1 | 8/2019 |
| RU | 2117972 C1 | 8/1998 |
| TW | 490391 B | 6/2002 |
| TW | 200417280 A | 9/2004 |
| TW | M338359 | 8/2008 |
| TW | 2014/35464 A | 9/2014 |
| TW | 2014/35464 A | 10/2014 |
| WO | WO98/47613 A1 | 10/1998 |
| WO | WO2004/087985 A2 | 10/2004 |
| WO | WO2008/055824 | 5/2008 |
| WO | WO2008/154517 A2 | 12/2008 |
| WO | WO2009/000547 A2 | 12/2008 |
| WO | WO2009/029111 A1 | 3/2009 |
| WO | WO2009/148861 | 12/2009 |
| WO | WO2010/120537 A2 | 10/2010 |
| WO | WO2010/147494 A1 | 12/2010 |
| WO | WO2012/138281 | 10/2012 |
| WO | WO2013/054367 A1 | 4/2013 |
| WO | WO2014/025876 A2 | 2/2014 |
| WO | WO2014/025900 | 2/2014 |
| WO | WO2014/113795 A1 | 7/2014 |
| WO | WO2014/113796 A1 | 7/2014 |
| WO | WO2014/113801 A1 | 7/2014 |
| WO | WO2015/168166 A1 | 11/2015 |

OTHER PUBLICATIONS

U.S. Office Action dated Dec. 31, 2018 in U.S. Appl. No. 15/795,843.
U.S. Office Action dated Apr. 5, 2018 in U.S. Appl. No. 15/441,130.
U.S. Notice of Allowance dated Oct. 31, 2018 in U.S. Appl. No. 15/441,130.
U.S. Office Action dated Dec. 30, 2016 in U.S. Appl. No. 15/004,794.
U.S. Notice of Allowance dated Apr. 12, 2017 in U.S. Appl.. No. 15/004,794.
U.S. Notice of Allowance dated Aug. 9, 2017 in U.S. Appl. No. 15/004,794.
U.S. Office Action dated Jun. 27, 2018 in U.S. Appl. No. 15/612,928.
U.S. Office Action dated Jan. 23, 2019 in U.S. Appl. No. 15/612,928.
U.S. Office Action dated Sep. 11, 2017 for U.S. Appl. No. 15/587,114.
U.S. Notice of Allowance dated Dec. 4, 2017 for U.S. Appl. No. 15/587,114.
U.S. Notice of Allowance dated Mar. 26, 2018 for U.S. Appl. No. 15/587,114.

(56) References Cited

OTHER PUBLICATIONS

U.S. Office Action dated Jul. 10, 2018 for U.S. Appl. No. 15/953,327.
U.S. Notice of Allowance dated Nov. 28, 2018 for U.S. Appl. No. 15/953,327.
U.S. Office Action dated Sep. 20, 2018 for U.S. Appl. No. 15/340,853.
U.S. Notice of Allowance dated Jan. 3, 2019 for U.S. Appl. No. 15/340,853.
U.S. Office Action dated May 15, 2018 for U.S. Appl. No. 15/507,734.
U.S. Notice of Allowance dated Sep. 25, 2018 for U.S. Appl. No. 15/507,734.
U.S. Office Action dated May 15, 2018 for U.S. Appl. No. 15/527,194.
U.S. Notice of Allowance dated Sep. 24, 2018 for U.S. Appl. No. 15/527,194.
U.S. Office Action dated May 25, 2018 for U.S. Appl. No. 15/526,969.
U.S. Notice of Allowance dated Oct. 18, 2018 for U.S. Appl. No. 15/526,969.
U.S. Notice of Allowance (Corrected) dated Nov. 28, 2018 for U.S. Appl. No. 15/526,969.
International Search Report and Written Opinion dated Jul. 16, 2015 in PCT/US15/028899.
International Preliminary Report on Patentability dated Nov. 17, 2016 in PCT/US15/028899.
International Search Report and Written Opinion dated Aug. 26, 2015 in PCT/US15/28067.
International Preliminary Report on Patentability dated Nov. 17, 2016 in PCT/US15/28067.
International Search Report and Written Opinion (ISA/KR) dated Jul. 7, 2017 in PCT/US17/24120.
International Preliminary Report on Patentability dated Oct. 4, 2018 in PCT/US17/24120.
European Search Report (Extended) dated Jan. 29, 2018 in EP Application No. 15837472.8.
International Search Report and Written Opinion dated Mar. 18, 2016 in PCT/US15/47891.
International Preliminary Report on Patentability dated Mar. 16, 2017 in PCT/US15/47891.
International Search Report and Written Opinion dated Mar. 7, 2016 in PCT/US15/61995.
International Preliminary Report on Patentability dated Jun. 8, 2017 in PCT/US15/61995.
International Search Report and Written Opinion dated Feb. 29, 2016 in PCT/US15/61668.
International Preliminary Report on Patentability dated Jun. 8, 2017 in PCT/US15/61668.
International Search Report and Written Opinion dated Oct. 18, 2016 in PCT/US16/41375.
International Preliminary Report on Patentability dated Jan. 25, 2018 in PCT/US16/41375.
European Search Report (Extended) dated Nov. 28, 2017 in EP Application No. 15785437.3.
European Office Action dated Oct. 23, 2018 in EP Application No. 15785437.3.
European Search Report (Extended) dated Dec. 1, 2017 in EP Application No. 15785891.1.
European Search Report (Extended) dated May 2, 2018 in EP Application No. 15862207.6.
European Search Report (Extended) dated May 24, 2018 in EP Application No. 15863517.7.
European Search Report (Extended) dated Dec. 14, 2018 in EP Application No. 16824923.3.
Chinese Office Action dated Dec. 27, 2018 in CN Application No. 201580029451.0.
Chinese Office Action dated Dec. 26, 2018 in CN Application No. 201580032579.2.
Avendano, E. et al., "Electrochromic Nickel-Oxide-Based Films with Minimized Bleached-State Absorptance," I 203rd Meeting of the Electrochemical Society, Electrochemical Society Proceedings vol. 2003-17, 2003, pp. 80-90.

Hutchins, M.G. et al, "The electrochromic behavior of tin-nickel oxide," Solar Energy Materials and Solar Cells, vol. 54, 1998, pp. 75-84.
Green, Sara, "Electrochromic nickel-tungsten oxides: optical, electrochemical and structural characterization of sputter-deposited thin films in the whole composition range," Dissertation, Digital Comprehensive Summaries of Uppsala Dissertations from the Faculty of Science and Technology 963, Uppsala University, Sweden, 2012.
Arvizu, M.A. et al., "Electrochromic $W_{1-x-y}Ti_xMo_yO_3$ thin films made by sputter deposition: Large optical modulation, good cycling durability, and approximate color neutrality," Chemistry of Materials [online, just accepted manuscript], Feb. 23, 2017, [retrieved on Feb. 24, 2017]. Retrieved from the internet: <http://pubs.acs.org> <DOI: 10.1021/acs.chemmater.6b05198>.
U.S. Appl. No. 16/088,024, filed Sep. 24, 2018, Pradhan et al.
U.S. Appl. No. 16/168,587, filed Oct. 23, 2018, Pradhan et al.
U.S. Appl. No. 16/205,084, filed Nov. 29, 2018, Pradhan et al.
U.S. Appl. No. 16/204,540, filed Nov. 29, 2018, Gillaspie et al.
U.S. Appl. No. 16/250,738, filed Jan. 17, 2019, Gillaspie et al.
Preliminary Amendment filed Sep. 24, 2018 for U.S. Appl. No. 16/088,024.
U.S. Office Action, dated Apr. 26, 2012, issued in U.S. Appl. No. 12/772,055.
U.S. Notice of Allowance, dated Sep. 18, 2012, issued in U.S. Appl. No. 12/772,055.
U.S. Office Action dated Jan. 20, 2012 issued in U.S. Appl. No. 12/772,075.
U.S. Office Action dated Aug. 16, 2012 issued in U.S. Appl. No. 12/772,075.
U.S. Office Action dated Dec. 26, 2012 in U.S. Appl. No. 12/772,075.
U.S. Notice of Allowance dated Jul. 10, 2013 in U.S. Appl. No. 12/772,075.
U.S. Office Action dated Jun. 25, 2013 in U.S. Appl. No. 13/610,684.
U.S. Notice of Allowance dated Jan. 21, 2014 in U.S. Appl. No. 13/610,684.
U.S. Office Action dated Aug. 6, 2014 in U.S. Appl. No. 14/052,455.
U.S. Notice of Allowance dated Jan. 22, 2015 in U.S. Appl. No. 14/052,455.
U.S. Notice of Allowance dated May 11, 2015 in U.S. Appl. No. 14/052,455.
U.S. Notice of Allowance dated May 28, 2015 in U.S. Appl. No. 14/209,993.
U.S. Notice of Allowance dated Aug. 4, 2015 in U.S. Appl. No. 14/209,993.
U.S. Office Action dated Jul. 28, 2016 in U.S. Appl. No. 14/841,511.
U.S. Notice of Allowance dated Jan. 11, 2017 in U.S. Appl. No. 14/841,511.
U.S. Notice of Allowance dated May 22, 2018 in U.S. Appl. No. 15/457,609.
U.S. Notice of Allowance dated Jul. 17, 2019 in U.S. Appl. No. 15/795,843.
U.S. Office Action dated Oct. 25, 2011 issued in U.S. Appl. No. 13/166,537.
U.S. Office Action dated Feb. 16, 2012 issued in U.S. Appl. No. 13/166,537.
U.S. Notice of Allowance dated May 31, 2012 issued in U.S. Appl. No. 13/166,537.
U.S. Notice of Allowance dated Feb. 14, 2014 for U.S. Appl. No. 13/627,798.
U.S. Office Action dated Nov. 20, 2012 in U.S. Appl. No. 12/814,277.
U.S. Final Office Action dated Jun. 27, 2013 in U.S. Appl. No. 12/814,277.
U.S. Notice of Allowance dated Mar. 12, 2014 in U.S. Appl. No. 12/814,277.
U.S. Office Action dated Nov. 20, 2012 in U.S. Appl. No. 12/814,279.
U.S. Final Office Action dated Jun. 27, 2013 in U.S. Appl. No. 12/814,279.
U.S. Notice of Allowance dated Mar. 17, 2014 in U.S. Appl. No. 12/814,279.
U.S. Office Action dated Jan. 14, 2015 in U.S. Appl. No. 13/462,725.
U.S. Final Office Action dated Jul. 23, 2015 in U.S. Appl. No. 13/462,725.

(56) References Cited

OTHER PUBLICATIONS

U.S. Notice of Allowance dated Nov. 25, 2015 in U.S. Appl. No. 13/462,725.
U.S. Office Action dated Aug. 12, 2016 in U.S. Appl. No. 14/683,541.
U.S. Notice of Allowance dated Jan. 27, 2017 in U.S. Appl. No. 14/683,541.
U.S. Notice of Allowance (corrected) dated Feb. 27, 2017 in U.S. Appl. No. 14/683,541.
U.S. Notice of Allowance dated Jul. 26, 2019 in U.S. Appl. No. 15/612,928.
Australian Examination Report dated Jan. 6, 2014 in AU Application No. 2011245431.
Australian Examination Report dated Apr. 19, 2016 in AU Application No. 2014210572.
Australian Examination Report dated Jun. 7, 2018 in AU Application No. 2017202249.
Australian Examination Report dated Dec. 17, 2018 in AU Application No. 2017202249.
Australian Examination Report dated Mar. 18, 2019 in AU Application No. 2017202249.
Chinese Office Action dated Jan. 8, 2015 in CN Application No. CN201180027892.9.
Chinese Office Action dated Aug. 31, 2015 in CN Application No. CN201180027892.9.
Chinese Office Action dated Mar. 31, 2016 in CN Application No. CN201180027892.9.
Chinese Office Action dated Aug. 28, 2018 in CN Application No. CN201610412630.9.
Chinese Office Action dated Mar. 22, 2019 in CN Application No. CN201610412630.9.
Chinese Office Action dated Sep. 28, 2016 in CN Application No. 201380031908.2.
Mexican Office Action dated Jun. 6, 2013 in MX Application No. MX/a/2012/012573.
Indian Office Action dated Jun. 19, 2018 in IN Application No. 3663/KOLNP/2012.
Japanese Office Action dated Jan. 6, 2015 in JP Application No. JP2013-508130.
Japanese Office Action dated Mar. 8, 2016 in JP Application No. JP2015-118553.
Japanese Office Action dated Nov. 21, 2017 in JP Application No. JP2016-215029.
Japanese Office Action dated Mar. 5, 2019 in JP Application No. JP2018-028971.
Korean Office Action dated Feb. 28, 2017 in KR Application No. 10-2012-7031407.
Korean Office Action dated Feb. 8, 2018 in KR Application No. 10-2018-7002491.
Korean Office Action dated Oct. 30, 2018 in KR Application No. 10-2018-7030647.
European Search Report dated May 13, 2014 in EP Application No. 11775488.7.
European Office Action dated Feb. 10, 2017 in EP Application No. 11775488.7.
European Office Action dated Oct. 16, 2017 in EP Application No. 11775488.7.
European Search Report (Partial Supplementary) dated Jan. 8, 2016 in EP Application No. 13785049.1.
European Search Report (Extended) dated Apr. 6, 2016 in EP Application No. 13785049.1.
European Office Action dated May 7, 2019 in EP Application No. 13785049.1.
Russian Office Action dated Feb. 25, 2015 in RU Application No. 2012151304.
Russian Office Action dated Mar. 12, 2019 in RU Application No. 2015148673.
Singapore Examination Report dated Nov. 5, 2013 in SG Application No. 201208018-0.
Taiwanese Office Action dated May 26, 2016 in TW Application No. 100115201.
Taiwanese Decision of Rejection dated Feb. 24, 2017 in TW Application No. 100115201.
Taiwanese Office Action dated Dec. 7, 2018 in TW Application No. 106128807.
Taiwanese Office Action dated Mar. 25, 2019 in TW Application No. 106128807.
Taiwanese Office Action dated Jul. 22, 2015 in TW Application No. 100115190.
Taiwanese Office Action dated Jun. 1, 2016 in TW Application No. 104144317.
Taiwanese Decision of Rejection dated Nov. 29, 2016 in TW Application No. 104144317.
Taiwanese Office Action dated Oct. 12, 2018 in TW Application No. 104144317.
Taiwanese Search Report dated Oct. 11, 2018 in TW Application No. 106118525.
International Search Report and Written Opinion, dated Sep. 14, 2011, issued in PCT/US2011/033906.
International Preliminary Report on Patentability dated Nov. 15, 2012 in PCT/US2011/033906.
International Search Report and Written Opinion, dated Jul. 7, 2011, issued in PCT/US2011/033822.
International Preliminary Report on Patentability, dated Nov. 15, 2012 in PCT/US2011/033822.
International Search Report and Written Opinion, dated Aug. 14, 2013 in PCT/US2013/038481.
International Preliminary Report on Patentability dated Nov. 13, 2014 in PCT/US2013/038481.
Chinese Office Action dated Jun. 15, 2017 in CN Application No. 201380031908.2.
Chinese Office Action dated Jul. 2, 2019 in CN Application No. 201580032579.2.
Brazilian Office Action dated Sep. 24, 2019 in BR Application No. 1120120278916.
Taiwanese Office Action dated Aug. 26, 2019 in TW Application No. 108106923.
International Search Report and Written Opinion dated Jul. 9, 2019 in PCT/US19/027931.
Burdis, et al., "Technology Advancements to Lower Costs of Electrochromic Window Glazings", SAGE Electronics, Inc., DE-PS26-06NT42764, Final Report, Apr. 2, 2010.
Velux SageGlass Flyer, 2007, 4 pages.
Hersh, H.N., "Mechanism of Electrochromism in WO3," Applied Physics Letters, vol. 27, No. 12, Dec. 15, 1975, pp. 646-648.
Yoshimura, et al., "Electrochromism in a Thin-Film Device Using $Li_2WO_4$ as an Li-Electrolyte", Japanese Journal of Applied Physics, vol. 22, No. 1, Jan. 1983, pp. 152-156.
Vink, et al., "Lithium Trapping at Excess Oxygen in Sputter-Deposited a-WO3 Films", Japanese Journal of Applied Physics, vol. 8, No. 3, Feb. 1, 1999, pp. 1540-1544.
U.S. Notice of Allowance dated Mar. 11, 2019 for U.S. Appl. No. 15/507,734.
U.S. Office Action dated Jul. 25, 2019 for U.S. Appl. No. 16/168,587.
U.S. Office Action dated Feb. 25, 2019 for U.S. Appl. No. 15/204,868.
U.S. Office Action dated Aug. 12, 2019 in U.S. Appl. No. 15/916,142.
U.S. Office Action dated Jul. 25, 2019 in U.S. Appl. No. 16/088,024.
U.S. Office Action dated Jul. 25, 2019 in U.S. Appl. No. 16/204,540.
U.S. Office Action dated Jul. 10, 2019 in U.S. Appl. No. 16/250,738.
U.S. Notice of Allowance dated Nov. 6, 2019 in U.S. Appl. No. 16/250,738.
Chinese Office Action dated Jul. 17, 2019 in CN Application No. 201580029451.0.
European Office Action dated Oct. 10, 2019 in EP Application No. 15785891.1.
Japanese Office Action dated Sep. 24, 2019 in JP Application No. 2017-527761.
Russian Office Action dated Apr. 11, 2019 in RU Application No. 2017120233.
Taiwanese Office Action dated Sep. 20, 2019 in TW Application No. 104139219, with translated search report only.
Russian Search Report dated Nov. 1, 2019 in RU Application No. 2018105193.
U.S. Appl. No. 16/660,660, filed Oct. 22, 2019, Kozlowski.

(56) References Cited

OTHER PUBLICATIONS

U.S. Notice of Allowance dated Dec. 3, 2019 in U.S. Appl. No. 15/795,843.
U.S. Notice of Allowance dated Dec. 19, 2019 in U.S. Appl. No. 15/612,928.
U.S. Notice of Allowance dated Nov. 21, 2019 for U.S. Appl. No. 15/204,868.
U.S. Final Office Action dated Jan. 6, 2010 in U.S. Appl. No. 16/088,024.
U.S. Notice of Allowability (corrected) dated Jan. 8, 2020 in U.S. Appl. No. 16/250,738.
Chinese Office Action dated Jan. 2, 2020 in CN. Application No. 201580072326.8.
U.S. Appl. No. 16/719,700, filed Dec. 18, 2019, Kozlowski et al.
U.S. Appl. No. 16/721,655, filed Dec. 19, 2019, Gillaspie et al.
Preliminary Amendment filed Dec. 23, 2019 for U.S. Appl. No. 16/721,655.
Chinese Office Action dated Mar. 5, 2020 in CN Application No. 201580029451.0.

800b: ENTRY LOAD LOCK 802 | EC LAYER STATION 806a | LITHIUM STATION 807a | IC LAYER STATION 806b | CE LAYER STATION 806c | LITHIUM STATION 807b | TCO LAYER STATION 808 | EXIT LOAD LOCK 804

FIGURE 8D

800c: ENTRY LOAD LOCK 802 | EC LAYER STATION 806a | IC LAYER STATION 806b | CE LAYER STATION 806c | LITHIUM STATION 807 | TCO LAYER STATION 808 | EXIT LOAD LOCK 804

FIGURE 8E

FABRICATION OF LOW DEFECTIVITY ELECTROCHROMIC DEVICES

CROSS-REFERENCE TO RELATED APPLICATIONS

This application is a continuation of and claims priority to U.S. application Ser. No. 15/340,853, entitled "FABRICATION OF LOW DEFECTIVITY ELECTROCHROMIC DEVICES," filed Nov. 1, 2016, which is a continuation-in-part of PCT Application No. PCT/US15/28067, entitled "FABRICATION OF LOW DEFECTIVITY ELECTROCHROMIC DEVICES," filed Apr. 28, 2015, which claims the benefit of U.S. Provisional Patent Application No. 61/988,111, filed May 2, 2014, each of which is incorporated herein by this reference and for all purposes.

BACKGROUND

Electrochromism is a phenomenon in which a material exhibits a reversible electrochemically-mediated change in an optical property when placed in a different electronic state, typically by being subjected to a voltage change. The optical property is typically one or more of color, transmittance, absorbance, and reflectance. One well known electrochromic material, for example, is tungsten oxide ($WO_3$). Tungsten oxide is a cathodic electrochromic material in which a coloration transition, transparent to blue, occurs by electrochemical reduction.

Electrochromic materials may be incorporated into, for example, windows and mirrors. The color, transmittance, absorbance, and/or reflectance of such windows and mirrors may be changed by inducing a change in the electrochromic material. One well known application of electrochromic materials, for example, is the rear view mirror in some cars. In these electrochromic rear view mirrors, the reflectivity of the mirror changes at night so that the headlights of other vehicles are not distracting to the driver.

While electrochromism was discovered in the 1960's, electrochromic devices still unfortunately suffer various problems and have not begun to realize their full commercial potential.

SUMMARY

The embodiments herein relate to electrochromic materials, electrochromic stacks, electrochromic devices, as well as methods and apparatus for making such materials, stacks, and devices. In various embodiments, a counter electrode material includes a novel composition of materials. For instance, the counter electrode material may include an anodically coloring electrochromic material and one or more additives. The anodically coloring electrochromic material may include a metal selected from the group consisting of chromium (Cr), manganese (Mn), iron (Fe), cobalt (Co), nickel (Ni), rhodium (Rh), ruthenium (Ru), vanadium (V), iridium (Ir), and combinations thereof. The additive may be selected from the group consisting of silver (Ag), arsenic (As), gold (Au), boron (B), cadmium (Cd), cesium (Cs), copper (Cu), europium (Eu), gallium (Ga), gadolinium (Gd), germanium (Ge), mercury (Hg), osmium (Os), lead (Pb), palladium (Pd), promethium (Pm), polonium (Po), platinum (Pt), radium (Ra), rubidium (Rb), terbium (Tb), technetium (Tc), thorium (Th), thallium (Tl), and combinations thereof. Other combinations of materials are possible as described further herein.

These and other features and advantages of the invention will be described in further detail below, with reference to the associated drawings.

BRIEF DESCRIPTION OF THE DRAWINGS

The following detailed description can be more fully understood when considered in conjunction with the drawings in which:

FIG. 8D depicts an integrated deposition system with two lithium deposition stations.

FIG. 8E depicts an integrated deposition system with one lithium deposition station.

DETAILED DESCRIPTION

Electrochromic Devices

Figure 1:
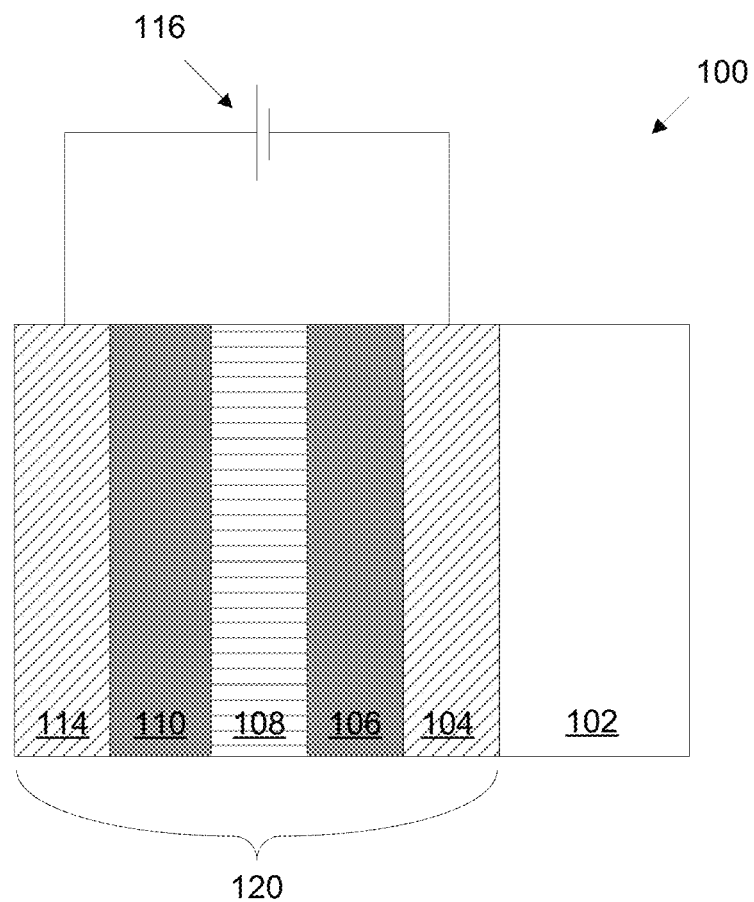
FIG. 1 is a schematic cross-section of an electrochromic device in accordance with embodiments of the invention.

A schematic cross-section of an electrochromic device 100 in accordance with some embodiments is shown in FIG. 1. The electrochromic device includes a substrate 102, a conductive layer (CL) 104, an electrochromic layer (EC) 106 (sometimes also referred to as a cathodically coloring layer), an ion conducting layer (IC) 108, a counter electrode layer (CE) 110 (sometimes also referred to as an anodically coloring layer), and a conductive layer (CL) 114. Elements 104, 106, 108, 110, and 114 are collectively referred to as an electrochromic stack 120. A voltage source 116 operable to apply an electric potential across the electrochromic stack 120 effects the transition of the electrochromic device from, e.g., a bleached state to a colored state. In other embodiments, the order of layers is reversed with respect to the substrate. That is, the layers are in the following order: substrate, conductive layer, counter electrode layer, ion conducting layer, electrochromic material layer, conductive layer.

It should be understood that the reference to a transition between a bleached state and colored state is non-limiting and suggests only one example, among many, of an electrochromic transition that may be implemented. Unless otherwise specified herein, whenever reference is made to a bleached-colored transition, the corresponding device or process encompasses other optical state transitions such non-reflective-reflective, transparent-opaque, etc. Further the term "bleached" refers to an optically neutral state, e.g., uncolored, transparent or translucent. Still further, unless specified otherwise herein, the "color" of an electrochromic transition is not limited to any particular wavelength or range of wavelengths. As understood by those of skill in the art, the choice of appropriate electrochromic and counter electrode materials governs the relevant optical transition.

In certain embodiments, the electrochromic device reversibly cycles between a bleached state and a colored state. In the bleached state, a potential is applied to the electrochromic stack 120 such that available ions in the stack that can cause the electrochromic material 106 to be in the colored state reside primarily in the counter electrode 110. When the potential on the electrochromic stack is reversed, the ions are transported across the ion conducting layer 108 to the electrochromic material 106 and cause the material to enter the colored state. A more detailed description of the transition from bleached to colored state, and from colored to bleached state, is included below in the description of FIGS. 2 and 3, but first the individual layers of stack 120 will be described in more detail in relation to FIG. 1.

In certain embodiments, all of the materials making up electrochromic stack 120 are inorganic, solid (i.e., in the solid state), or both inorganic and solid. Because organic materials tend to degrade over time, inorganic materials offer the advantage of a reliable electrochromic stack that can function for extended periods of time. Materials in the solid state also offer the advantage of not having containment and leakage issues, as materials in the liquid state often do. Each of the layers in the electrochromic device is discussed in detail, below. It should be understood that any one or more of the layers in the stack may contain some amount of organic material, but in many implementations one or more of the layers contains little or no organic matter. The same can be said for liquids that may be present in one or more layers in small amounts. It should also be understood that solid state material may be deposited or otherwise formed by processes employing liquid components such as certain processes employing sol-gels or chemical vapor deposition.

Referring again to FIG. 1, voltage source 116 is typically a low voltage electrical source and may be configured to operate in conjunction with radiant and other environmental sensors. Voltage source 116 may also be configured to interface with an energy management system, such as a computer system that controls the electrochromic device according to factors such as the time of year, time of day, and measured environmental conditions. Such an energy management system, in conjunction with large area electrochromic devices (i.e., an electrochromic window), can dramatically lower the energy consumption of a building.

Any material having suitable optical, electrical, thermal, and mechanical properties may be used as substrate 102. Such substrates include, for example, glass, plastic, and mirror materials. Suitable plastic substrates include, for example acrylic, polystyrene, polycarbonate, allyl diglycol carbonate, SAN (styrene acrylonitrile copolymer), poly(4-methyl-1-pentene), polyester, polyamide, etc. If a plastic substrate is used, it is preferably barrier protected and abrasion protected using a hard coat of, for example, a diamond-like protection coating, a silica/silicone anti-abrasion coating, or the like, such as is well known in the plastic glazing art. Suitable glasses include either clear or tinted soda lime glass, including soda lime float glass. The glass may be tempered or untempered. In some embodiments of electrochromic device 100 with glass, e.g. soda lime glass, used as substrate 102, there is a sodium diffusion barrier layer (not shown) between substrate 102 and conductive layer 104 to prevent the diffusion of sodium ions from the glass into conductive layer 104.

In some embodiments, the optical transmittance (i.e., the ratio of transmitted radiation or spectrum to incident radiation or spectrum) of substrate 102 is about 40 to 95%, e.g., about 90-92%. The substrate may be of any thickness, as long as it has suitable mechanical properties to support the electrochromic stack 120. While the substrate 102 may be of any size, in some embodiments, it is about 0.01 mm to 10 mm thick, preferably about 3 mm to 9 mm thick.

In some embodiments of the invention, the substrate is architectural glass. Architectural glass is glass that is used as a building material. Architectural glass is typically used in commercial buildings, but may also be used in residential buildings, and typically, though not necessarily, separates an indoor environment from an outdoor environment. In certain embodiments, architectural glass is at least 20 inches by 20 inches, and can be much larger, e.g., as large as about 72 inches by 120 inches. Architectural glass is typically at least about 2 mm thick. Architectural glass that is less than about 3.2 mm thick cannot be tempered. In some embodiments of the invention with architectural glass as the substrate, the substrate may still be tempered even after the electrochromic stack has been fabricated on the substrate. In some embodiments with architectural glass as the substrate, the substrate is a soda lime glass from a tin float line. The percent transmission over the visible spectrum of an architectural glass substrate (i.e., the integrated transmission across the visible spectrum) is generally greater than 80% for neutral substrates, but it could be lower for colored substrates. Preferably, the percent transmission of the substrate over the visible spectrum is at least about 90% (e.g., about 90-92%). The visible spectrum is the spectrum that a typical human eye will respond to, generally about 380 nm (purple) to about 780 nm (red). In some cases, the glass has a surface roughness of between about 10 and 30 nm.

On top of substrate 102 is conductive layer 104. In certain embodiments, one or both of the conductive layers 104 and 114 is inorganic and/or solid. Conductive layers 104 and 114 may be made from a number of different materials, including conductive oxides, thin metallic coatings, conductive metal nitrides, and composite conductors. Typically, conductive layers 104 and 114 are transparent at least in the range of wavelengths where electrochromism is exhibited by the electrochromic layer. Transparent conductive oxides include metal oxides and metal oxides doped with one or more metals. Examples of such metal oxides and doped metal oxides include indium oxide, indium tin oxide, doped indium oxide, tin oxide, doped tin oxide, zinc oxide, aluminum zinc oxide, doped zinc oxide, ruthenium oxide, doped ruthenium oxide and the like. Since oxides are often used for these layers, they are sometimes referred to as "transparent conductive oxide" (TCO) layers. Thin metallic coatings that are substantially transparent may also be used. Examples of metals used for such thin metallic coatings include transition metals including gold, platinum, silver, aluminum, nickel alloy, and the like. Thin metallic coatings based on silver, well known in the glazing industry, are also used. Examples of conductive nitrides include titanium nitrides, tantalum nitrides, titanium oxynitrides, and tantalum oxynitrides. The conductive layers 104 and 114 may also be composite conductors. Such composite conductors may be fabricated by placing highly conductive ceramic and metal wires or conductive layer patterns on one of the faces of the substrate and then over-coating with transparent conductive materials such as doped tin oxides or indium tin oxide. Ideally, such wires should be thin enough as to be invisible to the naked eye (e.g., about 100 μm or thinner).

In some embodiments, commercially available substrates such as glass substrates contain a transparent conductive layer coating. Such products may be used for both substrate 102 and conductive layer 104. Examples of such glasses include conductive layer coated glasses sold under the trademark TEC Glass™ by Pilkington, of Toledo, Ohio and SUNGATE™ 300 and SUNGATE™ 500 by PPG Industries of Pittsburgh, Pa. TEC Glass™ is a glass coated with a fluorinated tin oxide conductive layer.

In some embodiments of the invention, the same conductive layer is used for both conductive layers (i.e., conductive layers 104 and 114). In some embodiments, different conductive materials are used for each conductive layer 104 and 114. For example, in some embodiments, TEC Glass™ is used for substrate 102 (float glass) and conductive layer 104 (fluorinated tin oxide) and indium tin oxide is used for conductive layer 114. As noted above, in some embodiments employing TEC Glass™ there is a sodium diffusion barrier between the glass substrate 102 and TEC conductive layer 104.

In some implementations, the composition of a conductive layer, as provided for fabrication, should be chosen or tailored based on the composition of an adjacent layer (e.g., electrochromic layer 106 or counter electrode layer 110) in contact with the conductive layer. For metal oxide conductive layers, for example, conductivity is a function of the number of oxygen vacancies in the conductive layer material, and the number of oxygen vacancies in the metal oxide is impacted by the composition of the adjacent layer. Selection criteria for a conductive layer may also include the material's electrochemical stability and ability to avoid oxidation or more commonly reduction by a mobile ion species.

The function of the conductive layers is to spread an electric potential provided by voltage source 116 over surfaces of the electrochromic stack 120 to interior regions of the stack, with very little ohmic potential drop. The electric potential is transferred to the conductive layers though electrical connections to the conductive layers. In some embodiments, bus bars, one in contact with conductive layer 104 and one in contact with conductive layer 114, provide the electric connection between the voltage source 116 and the conductive layers 104 and 114. The conductive layers 104 and 114 may also be connected to the voltage source 116 with other conventional means.

In some embodiments, the thickness of conductive layers 104 and 114 is between about 5 nm and about 10,000 nm. In some embodiments, the thickness of conductive layers 104 and 114 are between about 10 nm and about 1,000 nm. In other embodiments, the thickness of conductive layers 104 and 114 are between about 10 nm and about 500 nm. In some embodiments where TEC Glass™ is used for substrate 102 and conductive layer 104, the conductive layer is about 400 nm thick. In some embodiments where indium tin oxide is used for conductive layer 114, the conductive layer is about 100 nm to 400 nm thick (280 nm in one embodiment). More generally, thicker layers of the conductive material may be employed so long as they provide the necessary electrical properties (e.g., conductivity) and optical properties (e.g., transmittance). Generally, the conductive layers 104 and 114 are as thin as possible to increase transparency and to reduce cost. In some embodiment, conductive layers are substantially crystalline. In some embodiment, conductive layers are crystalline with a high fraction of large equiaxed grains The thickness of the each conductive layer 104 and 114 is also substantially uniform. Smooth layers (i.e., low roughness, Ra) of the conductive layer 104 are desirable so that other layers of the electrochromic stack 120 are more compliant. In one embodiment, a substantially uniform conductive layer varies by no more than about ±10% in each of the aforementioned thickness ranges. In another embodiment, a substantially uniform conductive layer varies by no more than about ±5% in each of the aforementioned thickness ranges. In another embodiment, a substantially uniform conductive layer varies by no more than about ±2% in each of the aforementioned thickness ranges.

The sheet resistance ($R_s$) of the conductive layers is also important because of the relatively large area spanned by the layers. In some embodiments, the sheet resistance of conductive layers 104 and 114 is about 5 to 30 Ohms per square. In some embodiments, the sheet resistance of conductive layers 104 and 114 is about 15 Ohms per square. In general, it is desirable that the sheet resistance of each of the two conductive layers be about the same. In one embodiment, the two layers each have a sheet resistance of about 10-15 Ohms per square.

Overlaying conductive layer 104 is electrochromic layer 106. In embodiments of the invention, electrochromic layer 106 is inorganic and/or solid, in typical embodiments inorganic and solid. The electrochromic layer may contain any one or more of a number of different electrochromic materials, including metal oxides. Such metal oxides include tungsten oxide ($WO_3$), molybdenum oxide ($MoO_3$), niobium oxide ($Nb_2O_5$), titanium oxide ($TiO_2$), copper oxide (CuO), iridium oxide ($Ir_2O_3$), chromium oxide ($Cr_2O_3$), manganese oxide ($Mn_2O_3$), vanadium oxide ($V_2O_5$), nickel oxide ($Ni_2O_3$), cobalt oxide ($Co_2O_3$) and the like. In some embodiments, the metal oxide is doped with one or more dopants such as lithium, sodium, potassium, molybdenum, vanadium, titanium, and/or other suitable metals or compounds containing metals. Mixed oxides (e.g., W—Mo oxide, W—V oxide) are also used in certain embodiments. An electrochromic layer 106 comprising a metal oxide is capable of receiving ions transferred from counter electrode layer 110.

In some embodiments, tungsten oxide or doped tungsten oxide is used for electrochromic layer 106. In one embodiment of the invention, the electrochromic layer is made substantially of $WO_x$, where "x" refers to an atomic ratio of oxygen to tungsten in the electrochromic layer, and x is between about 2.7 and 3.5. It has been suggested that only sub-stoichiometric tungsten oxide exhibits electrochromism; i.e., stoichiometric tungsten oxide, $WO_3$, does not exhibit electrochromism. In a more specific embodiment, $WO_x$, where x is less than 3.0 and at least about 2.7 is used for the electrochromic layer. In another embodiment, the electrochromic layer is WOx, where x is between about 2.7 and about 2.9. Techniques such as Rutherford Backscattering Spectroscopy (RBS) can identify the total number of oxygen atoms which include those bonded to tungsten and those not bonded to tungsten. In some instances, tungsten oxide layers where x is 3 or greater exhibit electrochromism, presumably due to unbound excess oxygen along with sub-stoichiometric tungsten oxide. In another embodiment, the tungsten oxide layer has stoichiometric or greater oxygen, where x is 3.0 to about 3.5.

In certain embodiments, the tungsten oxide is crystalline, nanocrystalline, or amorphous. In some embodiments, the tungsten oxide is substantially nanocrystalline, with grain sizes, on average, from about 5 nm to 50 nm (or from about 5 nm to 20 nm), as characterized by transmission electron microscopy (TEM). The tungsten oxide morphology may also be characterized as nanocrystalline using x-ray diffraction (XRD); XRD. For example, nanocrystalline electrochromic tungsten oxide may be characterized by the following XRD features: a crystal size of about 10 to 100 nm (e.g., about 55 nm. Further, nanocrystalline tungsten oxide may exhibit limited long range order, e.g., on the order of several (about 5 to 20) tungsten oxide unit cells.

The thickness of the electrochromic layer 106 depends on the electrochromic material selected for the electrochromic layer. In some embodiments, the electrochromic layer 106 is about 50 nm to 2,000 nm, or about 200 nm to 700 nm. In some embodiments, the electrochromic layer is about 300 nm to about 500 nm. The thickness of the electrochromic layer 106 is also substantially uniform. In one embodiment, a substantially uniform electrochromic layer varies only about ±10% in each of the aforementioned thickness ranges. In another embodiment, a substantially uniform electrochromic layer varies only about ±5% in each of the aforementioned thickness ranges. In another embodiment, a substantially uniform electrochromic layer varies only about ±3% in each of the aforementioned thickness ranges.

Generally, in electrochromic materials, the colorization (or change in any optical property—e.g., absorbance, reflectance, and transmittance) of the electrochromic material is caused by reversible ion insertion into the material (e.g., intercalation) and a corresponding injection of a charge balancing electron. Typically some fraction of the ion responsible for the optical transition is irreversibly bound up in the electrochromic material. As explained below some or all of the irreversibly bound ions are used to compensate "blind charge" in the material. In most electrochromic materials, suitable ions include lithium ions ($Li^+$) and hydrogen ions ($H^+$) (i.e., protons). In some cases, however, other ions will be suitable. These include, for example, deuterium ions ($D^+$), sodium ions ($Na^+$), potassium ions ($K^+$), calcium ions ($Ca^{++}$), barium ions ($Ba^{++}$), strontium ions ($Sr^{++}$), and magnesium ions ($Mg^{++}$). In various embodiments described herein, lithium ions are used to produce the electrochromic phenomena. Intercalation of lithium ions into tungsten oxide ($WO_{3-y}(0<y\leq\sim0.3)$) causes the tungsten oxide to change from transparent (bleached state) to blue (colored state).

Referring again to FIG. 1, in electrochromic stack 120, ion conducting layer 108 overlays electrochromic layer 106. On top of ion conducting layer 108 is counter electrode layer 110. In some embodiments, counter electrode layer 110 is inorganic and/or solid. The counter electrode layer may comprise one or more of a number of different materials that are capable of serving as reservoirs of ions when the electrochromic device is in the bleached state. During an electrochromic transition initiated by, e.g., application of an appropriate electric potential, the counter electrode layer transfers some or all of the ions it holds to the electrochromic layer, changing the electrochromic layer to the colored state. Concurrently, the counter electrode layer colors with the loss of ions.

In some embodiments, suitable materials for the counter electrode layer include a base anodically coloring electrochromic material and one or more additive materials. The base anodically coloring material may be, for example, cobalt oxide, chromium oxide, iron oxide, iridium oxide, manganese oxide, nickel oxide, rhodium oxide, ruthenium oxide, vanadium oxide, and any combination thereof. In certain embodiments, the base anodically coloring electrochromic material includes a material selected from the group consisting of chromium oxide, manganese oxide, iron oxide, cobalt oxide, nickel oxide, rhodium oxide, and iridium oxide. In one example, the base anodically coloring electrochromic material is selected from the group consisting of chromium oxide, manganese oxide, nickel oxide, rhodium oxide, and iridium oxide. In another example, the base anodically coloring electrochromic material includes nickel oxide and/or iridium oxide.

The additive in various cases may be selected from the group consisting of silver (Ag), arsenic (As), gold (Au), boron (B), cadmium (Cd), cesium (Cs), copper (Cu), europium (Eu), gallium (Ga), gadolinium (Gd), germanium (Ge), mercury (Hg), osmium (Os), lead (Pb), palladium (Pd), promethium (Pm), polonium (Po), platinum (Pt), radium (Ra), rubidium (Rb), terbium (Tb), technetium (Tc), thorium (Th), thallium (Tl), and combinations thereof. In some embodiments, the additive is selected from the group consisting of Ga, Gd, Ge, Cu, and combinations thereof. The additive may include at least one of Ga, Gd, and Ge. In some implementations, the additive may include at least one of Ge and Cu. One reason that germanium may be especially useful is that germanium/germanium oxide show a high optical band gap.

In certain embodiments, the concentration of the additive metal material may be less than about 50% atomic, less than about 25% atomic, less than about 10% atomic, less than about 5% atomic, less than about 2% atomic, or less than about 1% atomic. The additional material should be added at an amount/concentration sufficient to maintain the anodic coloring properties of the electrode. The proper balance between the base anodically coloring electrochromic material and the additive depends on the particular materials being used, though one of ordinary skill in the art is readily capable of determining appropriate concentrations to maintain the overall anodically coloring property of the counter electrode. In certain embodiments, a halogen (i.e., one or more of fluorine (F), chlorine (Cl), bromine (Br), iodine (I), and astatine (As)) may also be added to the counter electrode, for example to promote improved color qualities.

The counter electrode layer may include nickel oxide in combination with an additive in certain cases. Example materials for the counter electrode layer in this case may include nickel silver oxide, nickel arsenic oxide, nickel gold oxide, nickel boron oxide, nickel cadmium oxide, nickel cesium oxide, nickel copper oxide, nickel europium oxide, nickel gadolinium oxide, nickel gallium oxide, nickel germanium oxide, nickel mercury oxide, nickel osmium oxide, nickel lead oxide, nickel palladium oxide, nickel promethium oxide, nickel polonium oxide, nickel platinum oxide, nickel radium oxide, nickel rubidium oxide, nickel terbium oxide, nickel technetium oxide, nickel thorium oxide, nickel thallium oxide, and combinations thereof.

In these or other cases, the counter electrode layer may include cobalt oxide in combination with an additive. Example materials for the counter electrode layer in this case may include cobalt silver oxide, cobalt arsenic oxide, cobalt gold oxide, cobalt boron oxide, cobalt cadmium oxide, cobalt cesium oxide, cobalt copper oxide, cobalt europium oxide, cobalt gadolinium oxide, cobalt gallium oxide, cobalt germanium oxide, cobalt mercury oxide, cobalt osmium oxide, cobalt lead oxide, cobalt palladium oxide, cobalt promethium oxide, cobalt polonium oxide, cobalt platinum oxide, cobalt radium oxide, cobalt rubidium oxide, cobalt terbium oxide, cobalt technetium oxide, cobalt thorium oxide, cobalt thallium oxide, and combinations thereof.

Where the counter electrode layer includes chromium oxide, example materials for the counter electrode layer may include chromium silver oxide, chromium arsenic oxide, chromium gold oxide, chromium boron oxide, chromium cadmium oxide, chromium cesium oxide, chromium copper oxide, chromium europium oxide, chromium gadolinium oxide, chromium gallium oxide, chromium germanium oxide, chromium mercury oxide, chromium osmium oxide, chromium lead oxide, chromium palladium oxide, chromium promethium oxide, chromium polonium oxide, chromium platinum oxide, chromium radium oxide, chromium rubidium oxide, chromium terbium oxide, chromium technetium oxide, chromium thorium oxide, chromium thallium oxide, and combinations thereof.

Where the counter electrode layer includes iron oxide in combination with an additive, example materials for the counter electrode layer may include iron silver oxide, iron arsenic oxide, iron gold oxide, iron boron oxide, iron cadmium oxide, iron cesium oxide, iron copper oxide, iron europium oxide, iron gadolinium oxide, iron gallium oxide, iron germanium oxide, iron mercury oxide, iron osmium oxide, iron lead oxide, iron palladium oxide, iron promethium oxide, iron polonium oxide, iron platinum oxide, iron radium oxide, iron rubidium oxide, iron terbium oxide, iron technetium oxide, iron thorium oxide, iron thallium oxide, and combinations thereof.

Where the counter electrode layer includes iridium oxide in combination with an additive, example materials for the counter electrode layer may include iridium silver oxide, iridium arsenic oxide, iridium gold oxide, iridium boron oxide, iridium cadmium oxide, iridium cesium oxide, iridium copper oxide, iridium europium oxide, iridium gadolinium oxide, iridium gallium oxide, iridium germanium oxide, iridium mercury oxide, iridium osmium oxide, iridium lead oxide, iridium palladium oxide, iridium promethium oxide, iridium polonium oxide, iridium platinum oxide, iridium radium oxide, iridium rubidium oxide, iridium terbium oxide, iridium technetium oxide, iridium thorium oxide, iridium thallium oxide, and combinations thereof.

Where the counter electrode layer includes manganese oxide in combination with an additive, example materials for the counter electrode layer may include manganese silver oxide, manganese arsenic oxide, manganese gold oxide, manganese boron oxide, manganese cadmium oxide, manganese cesium oxide, manganese copper oxide, manganese europium oxide, manganese gadolinium oxide, manganese gallium oxide, manganese germanium oxide, manganese mercury oxide, manganese osmium oxide, manganese lead oxide, manganese palladium oxide, manganese promethium oxide, manganese polonium oxide, manganese platinum oxide, manganese radium oxide, manganese rubidium oxide, manganese terbium oxide, manganese technetium oxide, manganese thorium oxide, manganese thallium oxide, and combinations thereof.

Where the counter electrode layer includes rhodium oxide in combination with an additive, example materials for the counter electrode layer may include rhodium silver oxide, rhodium arsenic oxide, rhodium gold oxide, rhodium boron oxide, rhodium cadmium oxide, rhodium cesium oxide, rhodium copper oxide, rhodium europium oxide, rhodium gadolinium oxide, rhodium gallium oxide, rhodium germanium oxide, rhodium mercury oxide, rhodium osmium oxide, rhodium lead oxide, rhodium palladium oxide, rhodium promethium oxide, rhodium polonium oxide, rhodium platinum oxide, rhodium radium oxide, rhodium rubidium oxide, rhodium terbium oxide, rhodium technetium oxide, rhodium thorium oxide, rhodium thallium oxide, and combinations thereof.

Where the counter electrode layer includes ruthenium oxide in combination with an additive, example materials for the counter electrode layer may include ruthenium silver oxide, ruthenium arsenic oxide, ruthenium gold oxide, ruthenium boron oxide, ruthenium cadmium oxide, ruthenium cesium oxide, ruthenium copper oxide, ruthenium europium oxide, ruthenium gadolinium oxide, ruthenium gallium oxide, ruthenium germanium oxide, ruthenium mercury oxide, ruthenium osmium oxide, ruthenium lead oxide, ruthenium palladium oxide, ruthenium promethium oxide, ruthenium polonium oxide, ruthenium platinum oxide, ruthenium radium oxide, ruthenium rubidium oxide, ruthenium terbium oxide, ruthenium technetium oxide, ruthenium thorium oxide, ruthenium thallium oxide, and combinations thereof.

Where the counter electrode layer includes vanadium oxide in combination with an additive, example materials for the counter electrode layer may include vanadium silver oxide, vanadium arsenic oxide, vanadium gold oxide, vanadium boron oxide, vanadium cadmium oxide, vanadium cesium oxide, vanadium copper oxide, vanadium europium oxide, vanadium gadolinium oxide, vanadium gallium oxide, vanadium germanium oxide, vanadium mercury oxide, vanadium osmium oxide, vanadium lead oxide, vanadium palladium oxide, vanadium promethium oxide, vanadium polonium oxide, vanadium platinum oxide, vanadium radium oxide, vanadium rubidium oxide, vanadium terbium oxide, vanadium technetium oxide, vanadium thorium oxide, vanadium thallium oxide, and combinations thereof.

The counter electrode layer may include one or more, in some cases two or more, of the materials listed in the previous paragraphs. For example, nickel germanium oxide may be combined with iridium gallium oxide, etc.

Some particular example materials for the counter electrode include, but are not limited to, nickel oxide, nickel tungsten oxide, nickel vanadium oxide, nickel chromium oxide, nickel aluminum oxide, nickel manganese oxide, nickel magnesium oxide, chromium oxide, iron oxide, cobalt oxide, rhodium oxide, iridium oxide, manganese oxide, Prussian blue. The materials (e.g., metal and oxygen) may be provided at different stoichiometric ratios as appropriate for a given application. Counter electrodes of other materials may be used, and in some cases may comprise cerium titanium oxide, cerium zirconium oxide, vanadium oxide, and mixtures of oxides (e.g., a mixture of $Ni_2O_3$ and $WO_3$), as noted above. Doped formulations of these oxides may also be used, with dopants including, e.g., tantalum and tungsten and the other additives listed above. Because counter electrode layer 110 contains the ions used to produce the electrochromic phenomenon in the electrochromic material when the electrochromic material is in the bleached state, the counter electrode preferably has high transmittance and a neutral color when it holds significant quantities of these ions. In some embodiments, nickel-tungsten oxide (NiWO) is used in the counter electrode layer along with an additive listed above. In certain embodiments, the amount of nickel present in the nickel-tungsten oxide can be up to about 90% by weight of the nickel-tungsten oxide. In a specific embodiment, the mass ratio of nickel to tungsten in the nickel-tungsten oxide is between about 4:6 and 6:4 (e.g., about 1:1). In one embodiment, the NiWO is between about 15% (atomic) Ni and about 60% Ni; between about 10% W and about 40% W; between about 30% O and about 75% O; and includes one or more additives as described herein. In another embodiment, the NiWO is between about 30% (atomic) Ni and about 45% Ni; between about 10% W and about 25% W; between about 35% O and about 50% O; and includes one or more additives as described herein.

When charge is removed from a counter electrode 110 (i.e., ions are transported from the counter electrode 110 to the electrochromic layer 106), the counter electrode layer will turn from a transparent state to a tinted state. For instance, a nickel tungsten oxide counter electrode 110 will switch from a transparent state to a brown state. Other counter electrode materials may exhibit different colors in their tinted states and/or may be relatively more transparent in their clear states compared to a nickel tungsten oxide counter electrode.

The counter electrode morphology may be crystalline, nanocrystalline, or amorphous. In some embodiments, where the counter electrode layer is nickel-tungsten oxide along with an additive listed above, the counter electrode material is amorphous or substantially amorphous. Substantially amorphous nickel-tungsten oxide counter electrodes have been found to perform better, under some conditions, in comparison to their crystalline counterparts. The amorphous state of the nickel-tungsten oxide may be obtained though the use of certain processing conditions, described below. While not wishing to be bound to any theory or mechanism, it is believed that amorphous nickel-tungsten oxide is produced by relatively higher energy atoms in the sputtering process. Higher energy atoms are obtained, for example, in a sputtering process with higher target powers, lower chamber pressures (i.e., higher vacuum), and smaller source to substrate distances. Under the described process conditions, higher density films, with better stability under UV/heat exposure are produced.

In some embodiments, the counter electrode morphology may include microcrystalline, nanocrystalline and/or amorphous phases. For example, the counter electrode may be, e.g., a material with an amorphous matrix having nanocrystals distributed throughout. In certain embodiments, the nanocrystals constitute about 50% or less of the counter electrode material, about 40% or less of the counter electrode material, about 30% or less of the counter electrode material, about 20% or less of the counter electrode material or about 10% or less of the counter electrode material (by weight or by volume depending on the embodiment). In certain embodiments, the nanocrystals have a maximum diameter of less than about 50 nm, in some cases less than about 25 nm, less than about 10 nm, or less than about 5 nm. In some cases, the nanocrystals have a mean diameter of about 50 nm or less, or about 10 nm or less, or about 5 nm or less (e.g., about 1-10 nm). In certain embodiments, it is desirable to have a nanocrystal size distribution where at least about 50% of the nanocrystals have a diameter within 1 standard deviation of the mean nanocrystal diameter, for example where at least about 75% of the nanocrystals have a diameter within 1 standard deviation of the mean nanocrystal diameter or where at least about 90% of the nanocrystals have a diameter within 1 standard deviation of the mean nanocrystal diameter. It has been found that counter electrodes with an amorphous matrix tend to operate more efficiently compared to counter electrodes that are relatively more crystalline. In certain embodiments, the additive may form a host matrix in which domains of the base anodically coloring material may be found. In various cases, the host matrix is substantially amorphous. In certain embodiments, the only crystalline structures in the counter electrode are formed from the base anodically coloring electrochromic material, in, e.g., oxide form. As mentioned, the additives may contribute to forming an amorphous host matrix that is not substantially crystalline, but which incorporates domains (e.g., nanocrystals in some cases) of the base anodically coloring electrochromic material. In other embodiments, the additive and the anodically coloring base material together form a chemical compound with covalent and/or ionic bonding. The compound may be crystalline, amorphous, or any combination thereof. In other embodiments, the anodically coloring base material forms a host matrix in which domains of the additive exist as discrete phases or pockets.

In some embodiments, the thickness of the counter electrode is about 50 nm about 650 nm. In some embodiments, the thickness of the counter electrode is about 100 nm to about 400 nm, preferably in the range of about 200 nm to 300 nm. The thickness of the counter electrode layer 110 is also substantially uniform. In one embodiment, a substantially uniform counter electrode layer varies only about ±10% in each of the aforementioned thickness ranges. In another embodiment, a substantially uniform counter electrode layer varies only about ±5% in each of the aforementioned thickness ranges. In another embodiment, a substantially uniform counter electrode layer varies only about ±3% in each of the aforementioned thickness ranges.

The amount of ions held in the counter electrode layer during the bleached state (and correspondingly in the electrochromic layer during the colored state) and available to drive the electrochromic transition depends on the composition of the layers as well as the thickness of the layers and the fabrication method. Both the electrochromic layer and the counter electrode layer are capable of supporting available charge (in the form of lithium ions and electrons) in the neighborhood of several tens of millicoulombs per square centimeter of layer surface area. The charge capacity of an electrochromic film is the amount of charge that can be loaded and unloaded reversibly per unit area and unit thickness of the film by applying an external voltage or potential. In one embodiment, the $WO_3$ layer has a charge capacity of between about 30 and about 150 $mC/cm^2/$micron. In another embodiment, the $WO_3$ layer has a charge capacity of between about 50 and about 100 $mC/cm^2/$micron. In one embodiment, a NiWO layer including an additive listed above has a charge capacity of between about 75 and about 200 $mC/cm^2/$micron. In another embodiment, the NiWO layer (with an additive listed above) has a charge capacity of between about 100 and about 150 $mC/cm^2/$micron.

In between electrochromic layer 106 and counter electrode layer 110, there is an ion conducting layer 108. Ion conducting layer 108 serves as a medium through which ions are transported (in the manner of an electrolyte) when the electrochromic device transforms between the bleached state and the colored state. Preferably, ion conducting layer 108 is highly conductive to the relevant ions for the electrochromic and the counter electrode layers, but has sufficiently low electron conductivity that negligible electron transfer takes place during normal operation. A thin ion conducting layer with high ionic conductivity permits fast ion conduction and hence fast switching for high performance electrochromic devices. In certain embodiments, the ion conducting layer 108 is inorganic and/or solid. When fabricated from a material and in a manner that produces relatively few defects, the ion conductor layer can be made very thin to produce a high performance device. In various implementations, the ion conductor material has an ionic conductivity of between about $10^8$ Siemens/cm or ohm$^{-1}$ cm$^{-1}$ and about $10^9$ Siemens/cm or ohm$^{-1}$ cm$^{-1}$ and an electronic resistance of about $10^{11}$ ohms-cm.

Examples of suitable ion conducting layers include silicates, silicon oxides, tungsten oxides, tantalum oxides, niobium oxides, and borates. The silicon oxides include silicon-aluminum-oxide. These materials may be doped with different dopants, including lithium. Lithium doped silicon oxides include lithium silicon-aluminum-oxide. In some embodiments, the ion conducting layer comprises a silicate-based structure. In other embodiments, suitable ion conductors particularly adapted for lithium ion transport include, but are not limited to, lithium silicate, lithium aluminum silicate, lithium aluminum borate, lithium aluminum fluoride, lithium borate, lithium nitride, lithium zirconium silicate, lithium niobate, lithium borosilicate, lithium phosphosilicate, and other such lithium-based ceramic materials, silicas, or silicon oxides, including lithium silicon-oxide. Any material, however, may be used for the ion conducting layer 108 provided it can be fabricated with low defectivity and it allows for the passage of ions between the counter electrode layer 110 to the electrochromic layer 106 while substantially preventing the passage of electrons.

In certain embodiments, the ion conducting layer is crystalline, nanocrystalline, or amorphous. Typically, the ion conducting layer is amorphous. In another embodiment, the ion conducting layer is nanocrystalline. In yet another embodiment, the ion conducting layer is crystalline.

In some embodiments, a silicon-aluminum-oxide (SiAlO) is used for the ion conducting layer 108. In a specific embodiment, a silicon/aluminum target used to fabricate the ion conductor layer via sputtering contains between about 6 and about 20 atomic percent aluminum. This defines the ratio of silicon to aluminum in the ion conducting layer. In some embodiments, the silicon-aluminum-oxide ion conducting layer 108 is amorphous.

The thickness of the ion conducting layer 108 may vary depending on the material. In some embodiments, the ion conducting layer 108 is about 5 nm to 100 nm thick, preferably about 10 nm to 60 nm thick. In some embodiments, the ion conducting layer is about 15 nm to 40 nm thick or about 25 nm to 30 nm thick. The thickness of the ion conducting layer is also substantially uniform. In one embodiment, a substantially uniform ion conducting layer varies by not more than about ±10% in each of the aforementioned thickness ranges. In another embodiment, a substantially uniform ion conducting layer varies by not more than about ±5% in each of the aforementioned thickness ranges. In another embodiment, a substantially uniform ion conducting layer varies by not more than about ±3% in each of the aforementioned thickness ranges.

Ions transported across the ion conducting layer between the electrochromic layer and the counter electrode layer serve to effect a color change in the electrochromic layer (i.e., change the electrochromic device from the bleached state to the colored state). Depending on the choice of materials for the electrochromic device stack, such ions include lithium ions (Li$^+$) and hydrogen ions (H$^+$) (i.e., protons). As mentioned above, other ions may be employed in certain embodiments. These include deuterium ions (D$^+$), sodium ions (Na$^+$), potassium ions (K$^+$), calcium ions (Ca$^{++}$), barium ions (Ba$^{++}$), strontium ions (Sr$^{++}$), and magnesium ions (Mg$^{++}$).

As noted, the ion conducting layer 108 should have very few defects. Among other problems, defects in the ion conducting layer may result in short circuits between the electrochromic layer and the counter electrode layer (described in more detail below in relation to FIG. 4). A short circuit occurs when electrical communication is established between oppositely charged conductive layers, e.g. a conductive particle makes contact with each of two conductive and electrically charged layers (as opposed to a "pin hole" which is a defect which does not create a short circuit between oppositely charged conductive layers). When a short circuit occurs, electrons rather than ions migrate between the electrochromic layer and the counter electrode, typically resulting in bright spots (i.e., spots where the window does not switch but instead, maintains the open circuit coloration which is often much lighter than the colored state) at the location of the short when the electrochromic device is otherwise in the colored state. The ion conducting layer is preferably as thin as possible, without any shorts between the electrochromic layer and the counter electrode layer. As indicated, low defectivity in the ion conducting layer 108 (or elsewhere in the electrochromic device) allows for a thinner ion conducting layer 108. Ion transport between the electrochromic layer and the counter electrode layer with electrochemical cycling is faster when using a thin ion conducting layer. To generalize, the defectivity criteria specified herein may apply to any specific layer (ion conducting layer or otherwise) in the stack or to the stack as a whole or to any portion thereof. Defectivity criteria will be further discussed below.

The electrochromic device 100 may include one or more additional layers (not shown) such as one or more passive layers. Passive layers used to improve certain optical properties may be included in electrochromic device 100. Passive layers for providing moisture or scratch resistance may also be included in the electrochromic device 100. For example, the conductive layers may be treated with anti-reflective or protective oxide or nitride layers. Other passive layers may serve to hermetically seal the electrochromic device 100.

Figure 2:
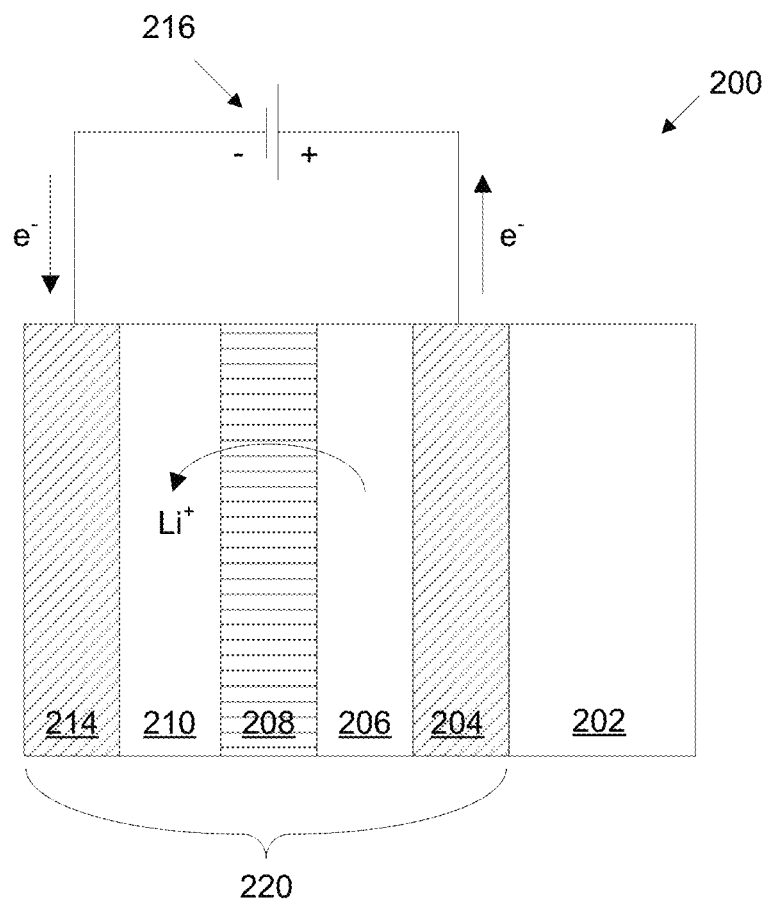
FIG. 2 is a schematic cross-section of an electrochromic device in a bleached state in accordance with specific embodiments of the invention.

FIG. 2 is a schematic cross-section of an electrochromic device in a bleached state (or transitioning to a bleached state). In accordance with specific embodiments, the electrochromic device 200 includes a tungsten oxide electrochromic layer (EC) 206 and a counter electrode layer (CE) 210 as described herein. In some cases, the tungsten oxide electrochromic layer 206 has a nanocrystalline, or substantially nanocrystalline, morphology. In some embodiments, the counter electrode layer 210 has an amorphous, or substantially amorphous, morphology. In some embodiments, the weight percent ratio of tungsten to nickel in the counter electrode is about 0.40-0.60

The electrochromic device 200 also includes substrate 202, conductive layer (CL) 204, ion conducting layer (IC) 208, and conductive layer (CL) 214. In some embodiments, the substrate 202 and conductive layer 204 together comprise a TEC-Glass™. As indicated, the electrochromic devices described herein, such as those of FIG. 2, often find beneficial application in architectural glass. Thus, in some embodiments, the substrate 202 is of the dimensions such that it may be classified as architectural glass. In some embodiments, the conductive layer 214 is indium tin oxide (ITO). In some embodiments, the ion conducting layer 208 is a silicon-aluminum-oxide.

The voltage source 216 is configured to apply a potential to electrochromic stack 220 through suitable connections (e.g., bus bars) to conductive layers 204 and 214. In some embodiments, the voltage source is configured to apply a potential of about 2 volts in order to drive a transition of the device from one optical state to another. The polarity of the potential as shown in FIG. 2 is such that the ions (lithium ions in this example) primarily reside in the counter electrode layer 210.

In embodiments employing an electrochromic layer of tungsten oxide and a counter electrode layer (e.g., of nickel tungsten oxide with an additive as described above, or another counter electrode material), the ratio of the electrochromic layer thickness to the counter electrode layer thickness may be about 1.7:1 to 2.3:1 (e.g., about 2:1). In some embodiments, the electrochromic tungsten oxide layer is about 200 nm to 700 nm thick. In further embodiments, the electrochromic tungsten oxide layer is about 400 nm to 500 nm thick. In some embodiments, the counter electrode layer is about 100 nm to 350 nm thick. In further embodiments, the counter electrode layer is about 200 nm to 250 nm thick. In yet further embodiments, the counter electrode layer is about 240 nm thick. Also, in some embodiments, the silicon-aluminum-oxide ion conducting layer 208 is about 10 nm to 100 nm thick. In further embodiments, the silicon-aluminum-oxide ion conducting layer is about 20 nm to 50 nm thick.

As indicated above, electrochromic materials may contain blind charge. The blind charge in an electrochromic material is the charge (e.g., negative charge in the case of tungsten oxide electrochromic material) that exists in the material as fabricated, absent compensation by oppositely charged ions or other charge carriers. With tungsten oxide, for example, the magnitude of the blind charge depends upon the excess oxygen concentration during sputtering of the tungsten oxide. Functionally, blind charge must be compensated before the ions employed to transform the electrochromic material can effectively change an optical property of the electrochromic material. Without prior compensation of the blind charge, ions supplied to an electrochromic material will irreversibly incorporate in the material and have no effect on the optical state of the material. Thus, an electrochromic device is typically provided with ions, such as lithium ions or protons, in an amount sufficient both to compensate the blind charge and to provide a supply of ions for reversibly switching the electrochromic material between two optical states. In many known electrochromic devices, charge is lost during the first electrochemical cycle in compensating blind charge.

In some embodiments, lithium is present in the electrochromic stack 220 in an amount sufficient to compensate the blind charge in the electrochromic layer 206 and then an additional amount of about 1.5 to 2.5 times the amount used to compensate the blind charge (by mass) in the stack (initially in the counter electrode layer 210 for example). That is, there is about 1.5 to 2.5 times the amount of lithium needed to compensate the blind charge that is provided for reversible cycling between the electrochromic layer 206 and the counter electrode layer 210 in the electrochromic stack 220. In some embodiments, there are enough lithium in the electrochromic stack 220 to compensate the blind charge in the electrochromic layer 206 and then about two times this amount (by mass) in the counter electrode layer 210 or elsewhere in the stack.

Figure 3:
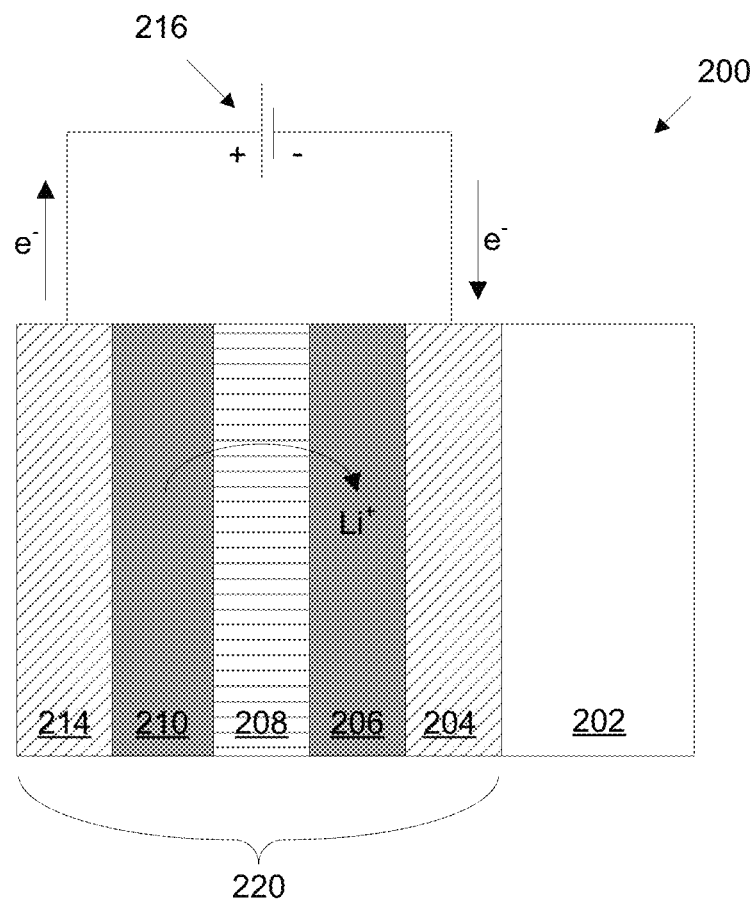
FIG. 3 is a schematic cross-section of an electrochromic device in a colored state in accordance with specific embodiments of the invention.

FIG. 3 is a schematic cross-section of electrochromic device 200 shown in FIG. 2 but in a colored state (or transitioning to a colored state). In FIG. 3, the polarity of voltage source 216 is reversed, so that the electrochromic layer is made more negative to accept additional lithium ions, and thereby transition to the colored state. As shown, lithium ions are transported across the ion conducting layer 208 to the tungsten oxide electrochromic layer 206. The tungsten oxide electrochromic layer 206 is shown in the colored state. The counter electrode 210 is also shown in the colored state. As explained, the counter electrode material becomes progressively more opaque as it gives up (deintercalates) lithium ions. In this example, there is a synergistic effect where the transition to colored states for both layers 206 and 210 are additive toward reducing the amount of light transmitted through the stack and substrate.

In certain embodiments, electrochromic devices of the types described above are very reliable, often substantially more so than counterpart devices of the prior art. Reliability may be characterized by various metrics. Some of these are described in ASTM E2141-06 (Standard Test Methods for Assessing the Durability of Absorptive Electrochromic Coatings on Sealed Insulating Glass Units). In some specific cases, the devices are able to cycle between two distinct optical states (e.g., between bleached and colored) over 50,000 times while maintaining a ratio of the bleached $T_{vis}$ to colored $T_{vis}$ (also know as PTR or photopic transmission ratio) of >4. The longevity of these electrochromic devices makes them suitable for use in applications where the electrochromic devices are expected to be in place for tens of years. Furthermore, the electrochromic devices in embodiments of the invention are able to cycle between bleached and unbleached states without losing transmissivity in the bleached state and without degradation of the color or other property in the unbleached state. In some cases, the high reliability of an electrochromic device in accordance with embodiments herein described is due in part to a design in which the thickness of the electrochromic layer and/or the thickness of the counter electrode layer in a stack do not substantially change during electrochemical cycling of the electrochromic device from their as deposited, post lithiation thickness (e.g., by no more than about 4%).

As indicated above, many electrochromic devices as described herein have a reduced number of defects; i.e., considerably fewer than are present in comparable prior devices. As used herein, the term "defect" refers to a defective point or region of an electrochromic device. Defects may be caused by electrical shorts or by pinholes. Further, defects may be characterized as visible or non-visible. In general, a defect in an electrochromic device does not change optical state (e.g., color) in response to an applied potential that is sufficient to cause non-defective regions of the electrochromic device to color or otherwise change optical state. Often a defect will be manifest as visually discernable anomalies in the electrochromic window or other device. Such defects are referred to herein as "visible" defects. Other defects are so small that they are not visually noticeable to the observer in normal use (e.g., such defects do not produce a noticeable light point when the device is in the colored state during daytime). A short is a localized electronically conductive pathway spanning the ion conducting layer (e.g., an electronically conductive pathway between the two TCO layers). A pinhole is a region where one or more layers of the electrochromic device are missing or damaged so that electrochromism is not exhibited. Pinholes are not electrical shorts. Three types of defects are of primary concern: (1) visible pinholes, (2) visible shorts, and (3) non-visible shorts. Typically, though not necessarily, a visible short will have defect dimension of at least about 3 micrometers resulting in a region, e.g. of about 1 cm in diameter, where the electrochromic effect is perceptibly diminished—these regions can be reduced significantly by isolating the defect causing the visible short so that to the naked eye the visible short will resemble only a visible pinhole. A visible pinhole will have a defect dimension of at least about 100 micrometers.

In some cases, an electrical short is created by a conductive particle lodging in the ion conducting layer, thereby causing an electronic path between the counter electrode layer and the electrochromic layer or the TCO associated with either one of them. In some other cases, a defect is caused by a particle on the substrate (on which the electrochromic stack is fabricated) and such particle causes layer delamination (sometimes called "pop-off") or the layers not to adhere to the substrate. Both types of defects are illustrated below in FIGS. 4 and 5A-5C. A delamination or pop-off defect can lead to a short if it occurs before a TCO or associated EC or CE is deposited. In such cases, the subsequently deposited TCO or EC/CE layer will directly contact an underlying TCO or CE/EC layer providing direct electronic conductive pathway. A few examples of defect sources are presented in the table below. The table below is intended to provide examples of mechanisms that lead to the different types of visible and non-visible defects. Additional factors exist which may influence how the EC window responds to a defect within the stack.

| Particle Location | Worst Case Failure | Effect |
| --- | --- | --- |
| On float | Pops off leaving pinhole | Pinhole |
| On TEC | Pops off allowing ITO-TEC short | Visible short Voltage drop |
| On EC | Leakage across IC | Visible short Voltage drop |
| On IC | Pops off leaving pinhole | Pinhole |
| On CE | Pops off leaving pinhole | Pinhole |

An electrical short, even a non-visible one, can cause leakage current across the ion conducting layer and result in a potential drop in the vicinity of the short. If the potential drop is of sufficient magnitude it will prevent the electrochromic device from undergoing an electrochromic transition in the vicinity of the short. In the case of a visible short the defect will appear as a light central region (when the device is in the colored state) with a diffuse boundary such that the device gradually darkens with distance from the center of the short. If there are a significant number of electrical shorts (visible or non-visible) concentrated in an area of an electrochromic device, they may collectively impact a broad region of the device whereby the device cannot switch in such region. This is because the potential difference between the EC and CE layers in such regions cannot attain a threshold level required to drive ions across the ion conductive layer. In certain implementations described herein, the shorts (both visible and non-visible) are sufficiently well controlled that the leakage current does not have this effect anywhere on the device. It should be understood that leakage current may result from sources other than short-type defects. Such other sources include broad-based leakage across the ion conducting layer and edge defects such as roll off defects as described elsewhere herein and scribe line defects. The emphasis here is on leakage caused only by points of electrical shorting across the ion conducting layer in the interior regions of the electrochromic device.

Figure 4:
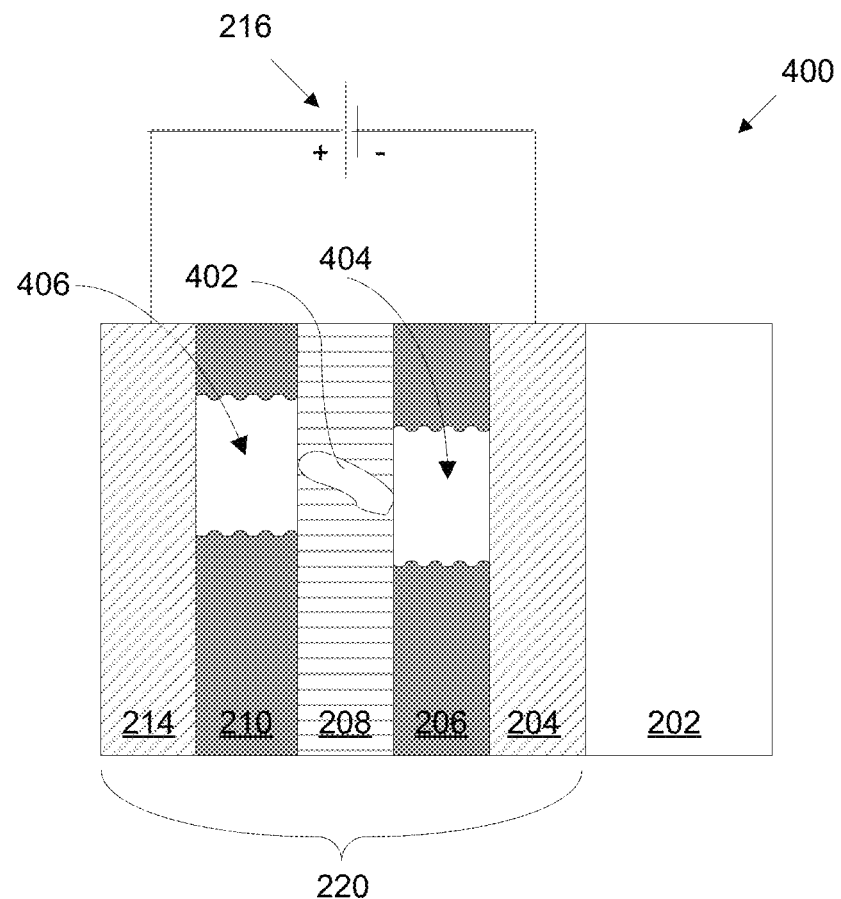
FIG. 4 is a schematic cross-section of an electrochromic device with a particle in the ion conducting layer causing a localized defect in the device.

FIG. 4 is a schematic cross-section of an electrochromic device 400 with a particle in the ion conducting layer causing a localized defect in the device. Electrochromic device 400 includes the same components as depicted in FIG. 2 for electrochromic device 200. In the ion conducting layer 208 of electrochromic device 400, however, there is a conductive particle 402 or other artifact causing a defect. Conductive particle 402 results in a short between electrochromic layer 206 and counter electrode layer 210. This short does not allow the flow of ions between electrochromic layer 206 and counter electrode layer 210, instead allowing electrons to pass locally between the layers, resulting in a transparent region 404 in the electrochromic layer 206 and a transparent region 406 in the counter electrode layer 210 when the remainder of layers 210 and 206 are in the colored state. That is, if electrochromic device 400 is in the colored state, conductive particle 402 renders regions 404 and 406 of the electrochromic device unable to enter into the colored state. Sometimes the defect regions are referred to as "constellations" because they appear as a series of bright spots (or stars) against a dark background (the remainder of the device being in the colored state). Humans will naturally direct their attention to the constellations and often find them distracting or unattractive.

Figure 5A:
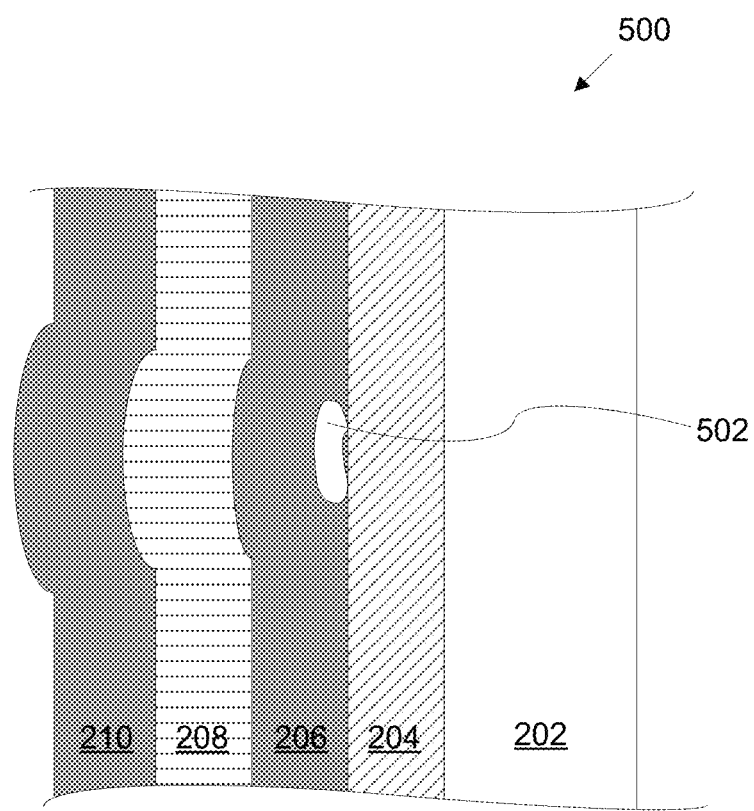
FIG. 5A is a schematic cross-section of an electrochromic device with a particle on the conductive layer prior to depositing the remainder of the electrochromic stack.

FIG. 5A is a schematic cross-section of an electrochromic device 500 with a particle 502 or other debris on conductive layer 204 prior to depositing the remainder of the electrochromic stack. Electrochromic device 500 includes the same components as electrochromic device 200. Particle 502 causes the layers in the electrochromic stack 220 to bulge in the region of particle 502, due to conformal layers 206-210 being deposited sequentially over particle 502 as depicted (in this example, layer 214 has not yet been deposited). While not wishing to be bound by a particular theory, it is believed that layering over such particles, given the relatively thin nature of the layers, can cause stress in the area where the bulges are formed. More particularly, in each layer, around the perimeter of the bulged region, there can be defects in the layer, e.g. in the lattice arrangement or on a more macroscopic level, cracks or voids. One consequence of these defects would be, for example, an electrical short between electrochromic layer 206 and counter electrode layer 210 or loss of ion conductivity in layer 208. These defects are not depicted in FIG. 5A, however.

Figure 5B:
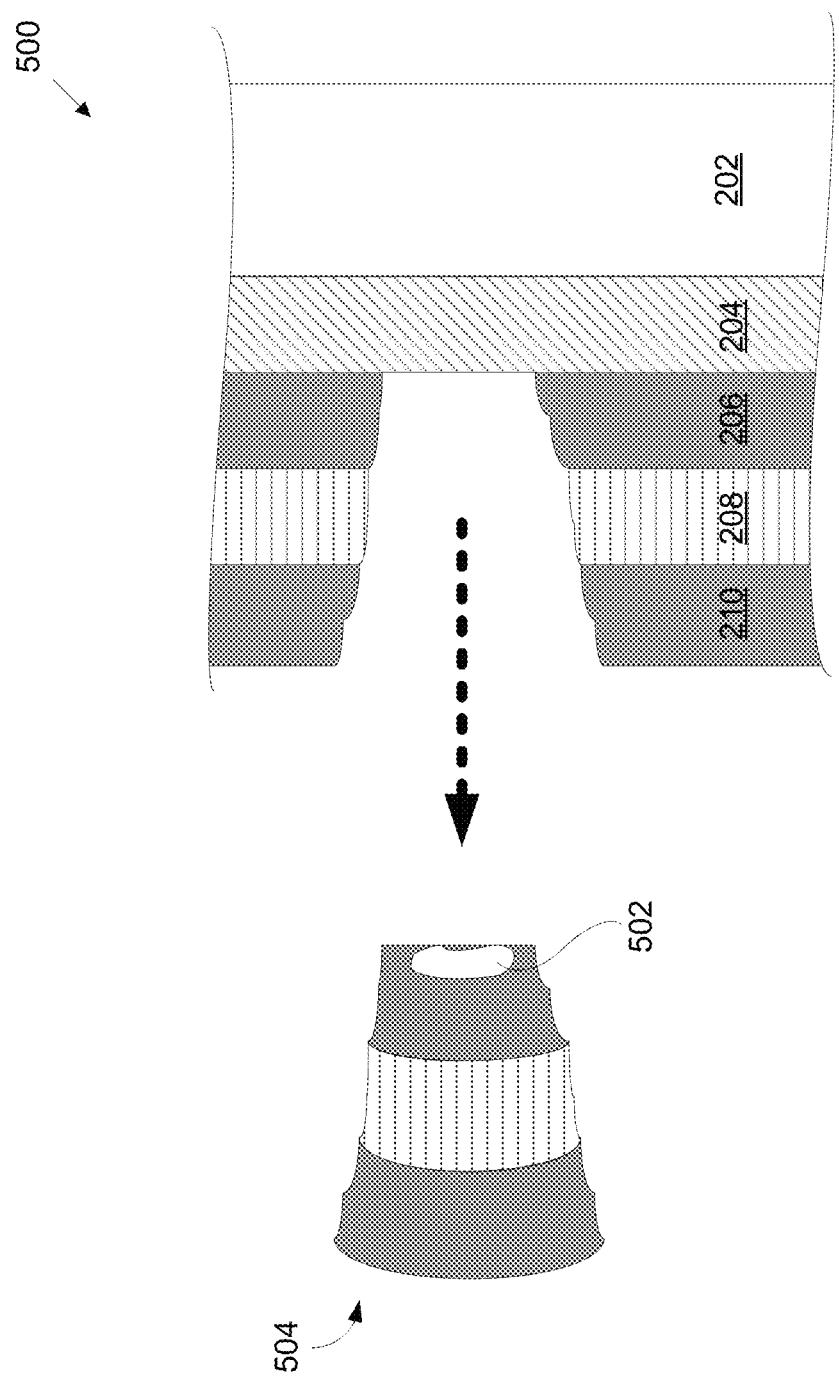
FIG. 5B is a schematic cross-section of the electrochromic device of FIG. 5A, where a "pop off" defect is formed during electrochromic stack formation.
Figure 5C:
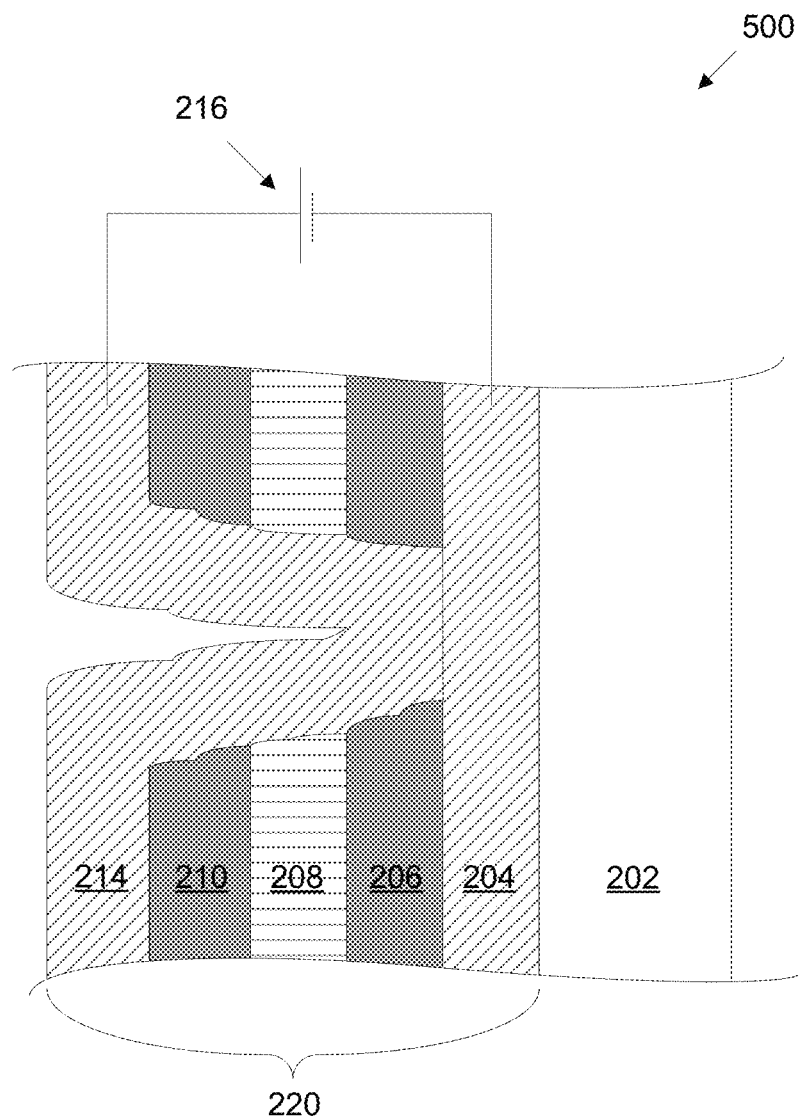
FIG. 5C is a schematic cross-section of the electrochromic device of FIG. 5B, showing an electrical short that is formed from the pop off defect once the second conductive is deposited.

Referring to FIG. 5B, another consequence of defects caused by particle 502 is called a "pop-off." In this example, prior to deposition of conductive layer 214, a portion above the conductive layer 204 in the region of particle 502 breaks loose, carrying with it portions of electrochromic layer 206, ion conducting layer 208, and counter electrode layer 210. The "pop-off" is piece 504, which includes particle 502, a portion of electrochromic layer 206, as well as ion conducting layer 208 and counter electrode layer 210. The result is an exposed area of conductive layer 204. Referring to FIG. 5C, after pop-off and once conductive layer 214 is deposited, an electrical short is formed where conductive layer 214 comes in contact with conductive layer 204. This electrical short would leave a transparent region in electrochromic device 500 when it is in the colored state, similar in appearance to the defect created by the short described above in relation to FIG. 4.

Pop-off defects due to particles or debris on substrate 202 or 204 (as described above), on ion conducting layer 208, and on counterelectrode layer 210 may also occur, causing pinhole defects when the electrochromic device is in the colored state. Also, if particle 502 is large enough and does not cause a pop-off, it might be visible when electrochromic device 500 is in the bleached state.

The electrochromic devices in embodiments of the invention are also scalable to substrates smaller or larger than architectural glass. An electrochromic stack can be deposited onto substrates that are a wide range of sizes, up to about 12 inches by 12 inches, or even 80 inches by 120 inches. The capability of manufacturing electrochromic devices of 20 by 20 inches allows the manufacture of electrochromic architectural glass for many applications.

Even very small defects, ones that do not create noticeable points of light or constellations, can cause serious performance problems. For example, small shorts, particularly multiple instances of them in a relatively small area, can cause a relatively large leakage current. As a result, there may be a large local potential drop which prevents the electrochromic device from switching in the vicinity of the leakage current. Hence small defects can limit the scalability of electrochromic devices and sometimes preclude deployment on architectural glass.

In one embodiment, the number of visible pinhole defects is no greater than about 0.04 per square centimeter. In another embodiment, the number of visible pinhole defects is no greater than about 0.02 per square centimeter, and in more specific embodiments, the number of such defects is no greater than about 0.01 per square centimeter. Typically, the visible short-type defects are individually treated after fabrication to leave short-related pinholes as the only visible defects. In one embodiment, the number of visible short-related pinhole defects is no greater than about 0.005 per square centimeter. In another embodiment, the number of visible short-related pinhole defects is no greater than about 0.003 per square centimeter, and in more specific embodiments, the number of such defects is no greater than about 0.001 per square centimeter. In one embodiment, the total number of visible defects, pinholes and short-related pinholes created from isolating visible short-related defects, is less than about 0.1 defects per square centimeter, in another embodiment less than about 0.08 defects per square centimeter, in another embodiment less than about 0.045 defects per square centimeter (less than about 450 defects per square meter of window).

In some embodiments, the number of non-visible electrical short defects results in leakage currents of less than about 5 $\mu A/cm^2$ at ±2V bias. These values apply across the entire face of the electrochromic device (i.e., there is no region of the device (anywhere on the device) having a defect density greater than the recited value).

In some embodiments, the electrochromic device has no visible defects greater than about 1.6 mm in diameter (the largest transverse dimension of the defect). In another embodiment, the device has no visible defects greater than about 0.5 mm in diameter, in another embodiment the device has no visible defects greater than about 100 µm in diameter.

In some embodiments, electrochromic glass is integrated into an insulating glass unit (IGU). An insulating glass unit consists of multiple glass panes assembled into a unit, generally with the intention of maximizing the thermal insulating properties of a gas contained in the space formed by the unit while at the same time providing clear vision through the unit. Insulating glass units incorporating electrochromic glass would be similar to insulating glass units currently known in the art, except for electrical leads for connecting the electrochromic glass to voltage source. Due to the higher temperatures (due to absorption of radiant energy by an electrochromic glass) that electrochromic insulating glass units may experience, more robust sealants than those used in conventional insulating glass units may be necessary. For example, stainless steel spacer bars, high temperature polyisobutylene (PIB), new secondary sealants, foil coated PIB tape for spacer bar seams, and the like.

Method of Fabricating Electrochromic Windows

Deposition of the Electrochromic Stack

As mentioned in the summary above, one aspect of the invention is a method of fabricating an electrochromic window. In a broad sense, the method includes sequentially depositing on a substrate (i) an electrochromic layer, (ii) an ion conducting layer, and (iii) a counter electrode layer to form a stack in which the ion conducting layer separates the electrochromic layer and the counter electrode layer. The sequential deposition employs a single integrated deposition system having a controlled ambient environment in which the pressure, temperature, and/or gas composition are controlled independently of an external environment outside of the integrated deposition system, and the substrate does not leave the integrated deposition system at any time during the sequential deposition of the electrochromic layer, the ion conducting layer, and the counter electrode layer. (Examples of integrated deposition systems which maintain controlled ambient environments are described in more detail below in relation to FIGS. 8A-8E.) The gas composition may be characterized by the partial pressures of the various components in the controlled ambient environment. The controlled ambient environment also may be characterized in terms of the number of particles or particle densities. In certain embodiments, the controlled ambient environment contains fewer than 350 particles (of size 0.1 micrometers or larger) per $m^3$. In certain embodiments, the controlled ambient environment meets the requirements of a class 100 clean room (US FED STD 209E). In certain embodiments, the controlled ambient environment meets the requirements of a class 10 clean room (US FED STD 209E). The substrate may enter and/or leave the controlled ambient environment in a clean room meeting class 100 or even class 10 requirements.

Typically, but not necessarily, this method of fabrication is integrated into a multistep process for making an electrochromic window using architectural glass as the substrate. For convenience, the following description contemplates the method and its various embodiments in the context of a multistep process for fabricating an electrochromic window, but methods of the invention are not so limited. Electrochromic mirrors and other devices may be fabricated using some or all of the operations and approaches described herein.

Figure 6A:
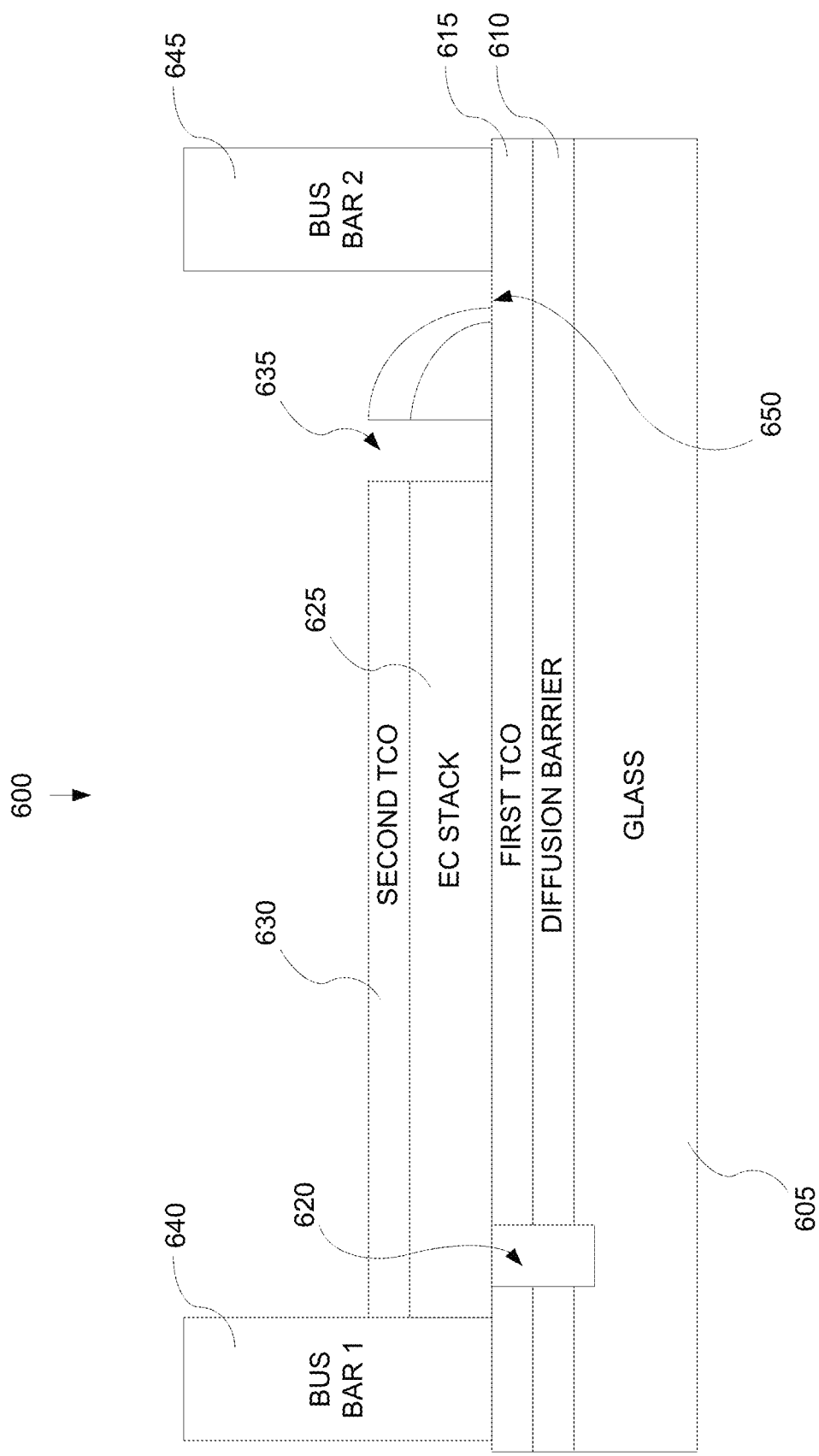
FIG. 6A depicts a cross-sectional representation of an electrochromic window device in accord with the multistep process description provided in relation to FIG. 7A.
Figure 6B:
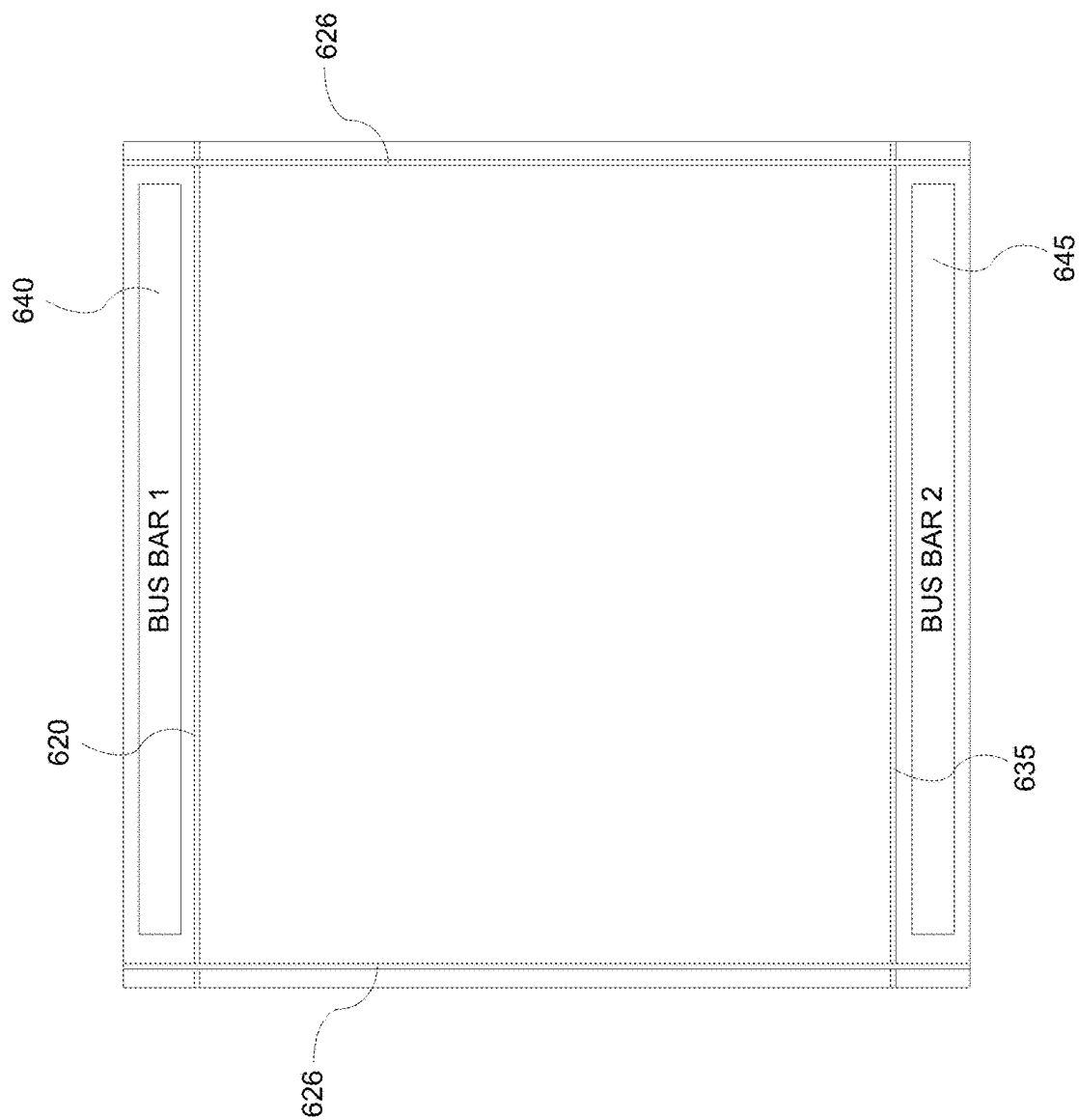
FIG. 6B depicts a top view of an electrochromic device showing location of trenches cut into the device.
Figure 7A:
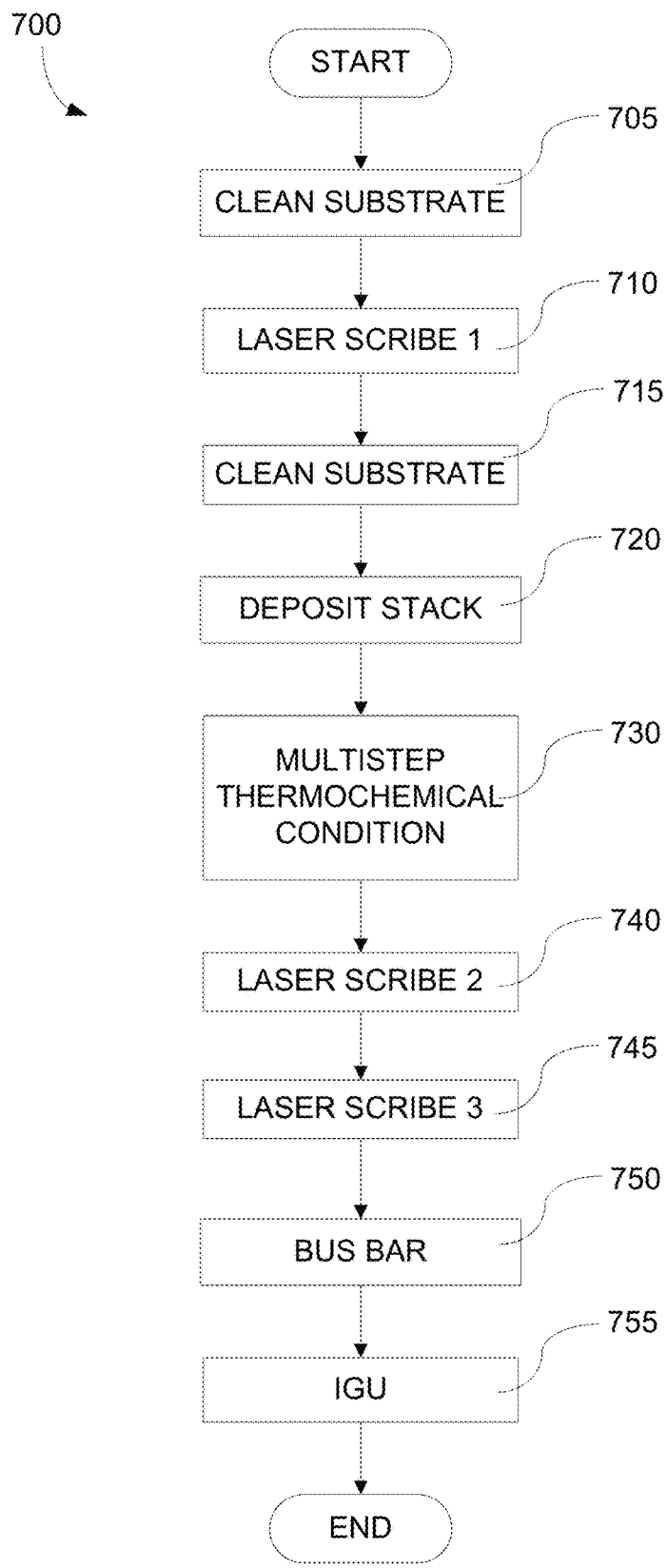
FIG. 7A depicts a process flow describing a method of fabricating an electrochromic window.
Figure 7B:
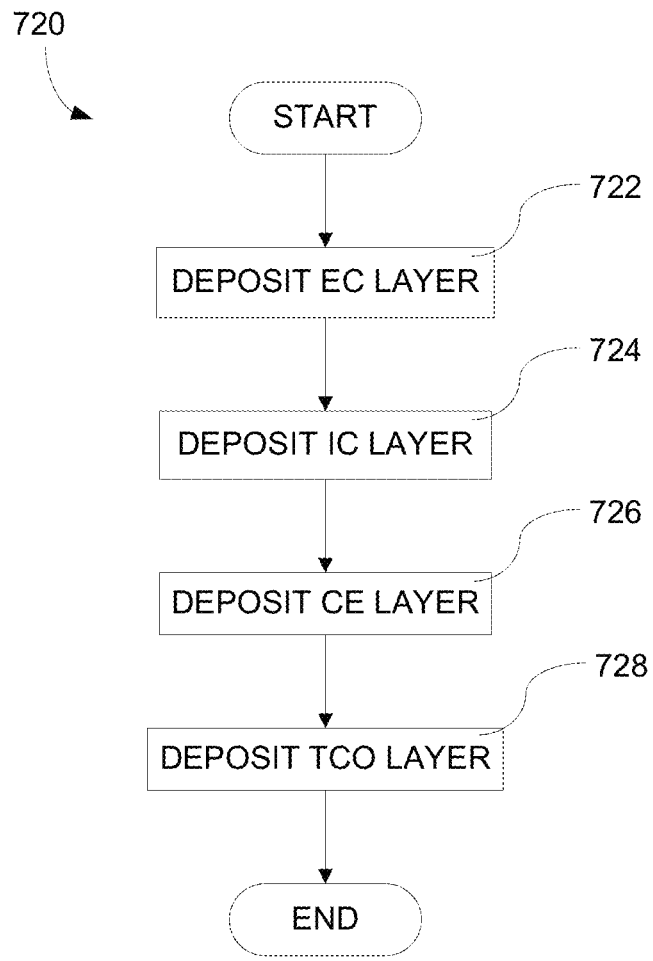
FIGS. 7B-7D depict methods of fabricating an electrochromic stack which is part of an electrochromic device of the invention.
Figure 7C:
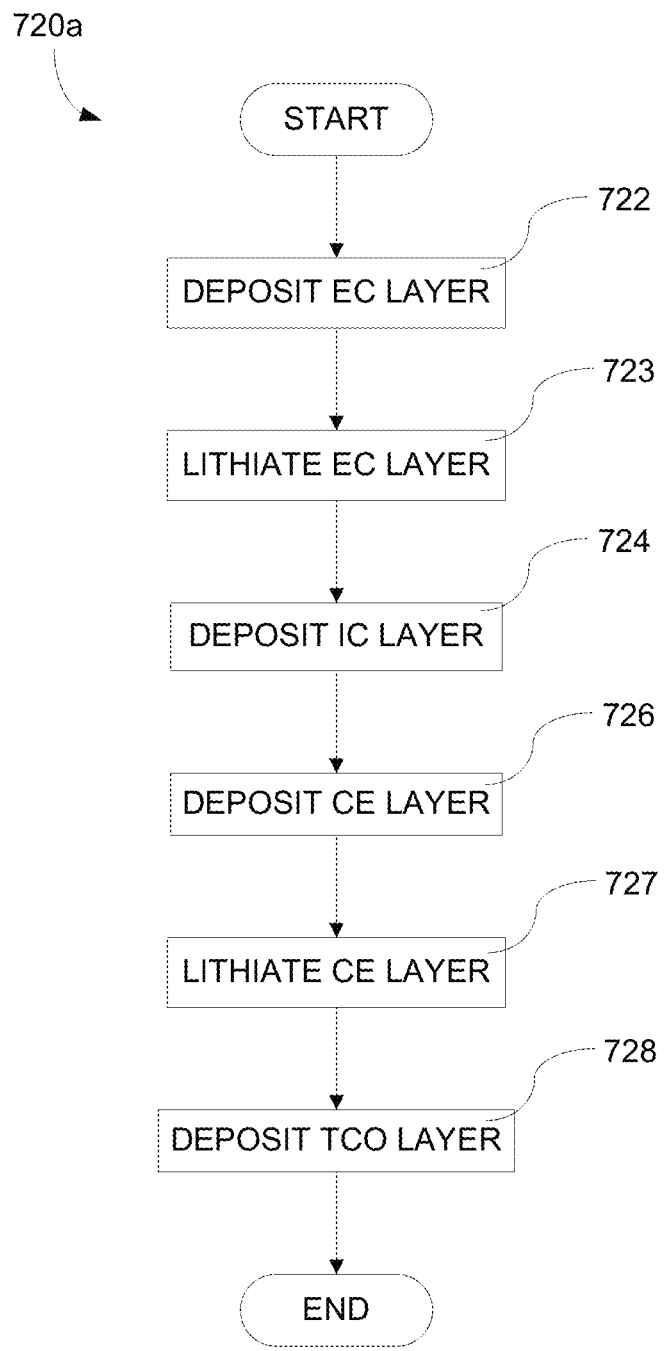
Figure 7D:
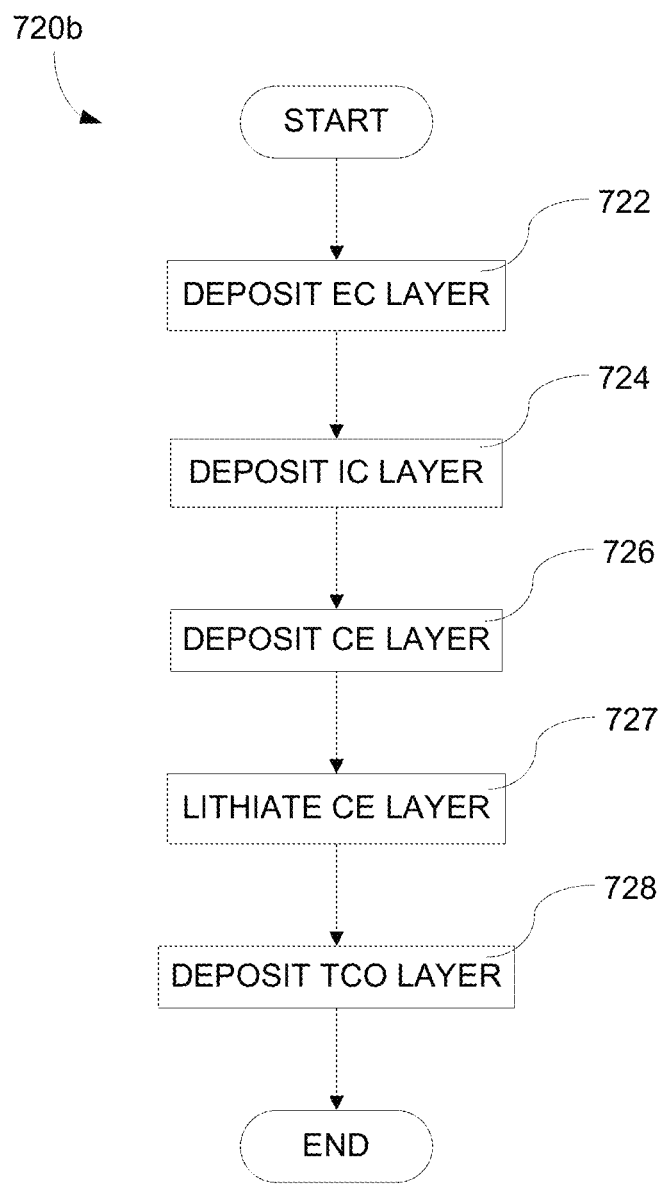
Figure 7E:
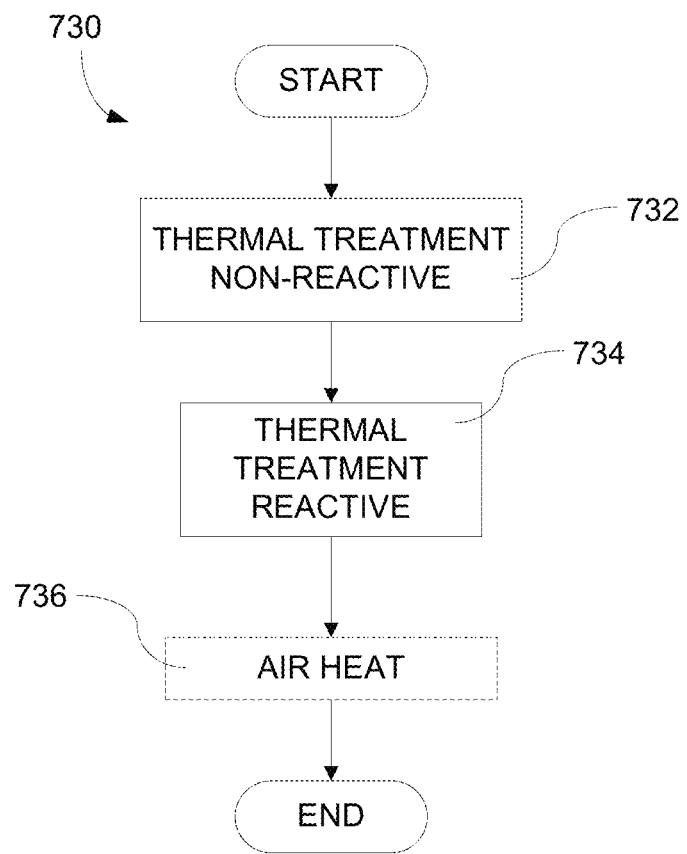
FIG. 7E depicts a process flow for a conditioning process used to fabricate an electrochromic device of the invention.

FIG. 6A is a cross-sectional representation of an electrochromic window device, 600, in accord with a multistep process such as that described in relation to FIG. 7A. FIG. 7A depicts a process flow describing a method, 700, of fabricating an electrochromic window which incorporates electrochromic device 600. FIG. 6B is a top view of device 600 showing the location of trenches cut into the device. Thus, FIGS. 6A-B and 7A will be described together. One aspect of the description is an electrochromic window including device 600 and another aspect of the description is a method, 700, of fabricating an electrochromic window which includes device 600. Included in the following description are descriptions of FIGS. 7B-7E. FIGS. 7B-7D depict specific methods of fabricating an electrochromic stack which is part of device 600. FIG. 7E depicts a process flow for a conditioning process used in fabricating, e.g., device 600.

FIG. 6A shows a specific example of an electrochromic device, 600, which is fabricated starting with a substrate made of glass 605 which optionally has a diffusion barrier 610 coating and a first transparent conducting oxide (TCO) coating 615 on the diffusion barrier. Method 700 employs a substrate that is, for example, float glass with sodium diffusion barrier and antireflective layers followed by a transparent conductive layer, for example a transparent conductive oxide 615. As mentioned above, substrates suitable for devices of the invention include glasses sold under the trademarks TEC Glass® by Pilkington of Toledo, Ohio, and SUNGATE® 300 and SUNGATE® 500 by PPG Industries, of Pittsburgh, Pa. The first TCO layer 615 is the first of two conductive layers used to form the electrodes of electrochromic device 600 fabricated on the substrate.

Method 700 begins with a cleaning process, 705, where the substrate is cleaned to prepare it for subsequent processing. As mentioned above, it is important to remove contaminants from the substrate because they can cause defects in the device fabricated on the substrate. One critical defect is a particle or other contaminant that creates a conductive pathway across the IC layer and thus shorts the device locally causing visually discernable anomalies in the electrochromic window. One example of a cleaning process and apparatus suitable for the fabrication methods of the invention is Lisec™ (a trade name for a glass washing apparatus and process available from (LISEC Maschinenbau GmbH of Seitenstetten, Austria).

Cleaning the substrate may include mechanical scrubbing as well as ultrasonic conditioning to remove unwanted particulates. As mentioned, particulates may lead to cosmetic flaws as well as local shorting within the device.

Once the substrate is cleaned, a first laser scribe process, 710, is performed in order to remove a line of the first TCO layer on the substrate. In one embodiment, the resulting trench ablates through both the TCO and the diffusion barrier (although in some cases the diffusion barrier is not substantially penetrated). FIG. 6A depicts this first laser scribe trench, 620. A trench is scribed in the substrate across the entire length of one side of the substrate in order to isolate an area of the TCO, near one edge of the substrate, which will ultimately make contact with a first bus bar, 640, used to provide current to a second TCO layer, 630, which is deposited on top of electrochromic (EC) stack 625 (which includes the electrochromic, ion conducting and counter electrode layers as described above). FIG. 6B shows schematically (not to scale) the location of trench 620. In the depicted embodiment, the non-isolated (main) portion of the first TCO layer, on the diffusion barrier, ultimately makes contact with a second bus bar, 645. Isolation trench 620 may be needed because, in certain embodiments, the method of attaching the first bus bar to the device includes pressing it through the device stack layers after they are laid down (both on the isolated portion of the first TCO layer and the main portion of the first TCO layer). Those of skill in the art will recognize that other arrangements are possible for providing current to the electrodes, in this case TCO layers, in the electrochromic device. The TCO area isolated by the first laser scribe is typically an area along one edge of the substrate that will ultimately, along with the bus bars, be hidden when incorporated into the integrated glass unit (IGU) and/or window pane, frame or curtain wall. The laser or lasers used for the first laser scribe are typically, but not necessarily, pulse-type lasers, for example diode-pumped solid state lasers. For example, the laser scribes can be performed using a suitable laser from IPG Photonics (of Oxford Mass.), or from Ekspla (of Vilnius Lithuania).

The laser trench is dug along a side of the substrate from end to end to isolate a portion of the first TCO layer; the depth and width dimensions of trench 620 made via first laser scribe 710 should be sufficient to isolate the first TCO layer from the bulk TCO once the device is subsequently deposited. The depth and width of the trench should be sufficient to prevent any remaining particulates to short across the trench. In one embodiment, the trench is between about 300 nm and 500 nm deep and between about 20 μm and 50 μm wide. In another embodiment, the trench is between about 350 nm and 450 nm deep and between about 30 μm and 45 μm wide. In another embodiment, the trench is about 400 nm deep and about 40 μm wide.

After the first laser scribe 710, the substrate is cleaned again (operation 715), typically but not necessarily, using cleaning methods described above. This second cleaning process is performed to remove any debris caused by the first laser scribe. Once cleaning operation 715 is complete, the substrate is ready for deposition of EC stack 625. This is depicted in process flow 700 as process 720. As mentioned above, the method includes sequentially depositing on a substrate (i) an EC layer, (ii) an IC layer, and (iii) a CE layer to form a stack in which the IC layer separates the EC layer and the CE layer using a single integrated deposition system having a controlled ambient environment in which the pressure and/or gas composition are controlled independently of an external environment outside of the integrated deposition system, and the substrate does not leave the integrated deposition system at any time during the sequential deposition of the EC layer, the IC layer, and the CE layer. In one embodiment, each of the sequentially deposited layers is physical vapor deposited. In general the layers of the electrochromic device may be deposited by various techniques including physical vapor deposition, chemical vapor deposition, plasma enhanced chemical vapor deposition, and atomic layer deposition, to name a few. The term physical vapor deposition as used herein includes the full range of art understood PVD techniques including sputtering, evaporation, ablation, and the like. FIG. 7B depicts one embodiment of process 720. First the EC layer is deposited on the substrate, process 722, then the IC layer is deposited, process 724, then the CE layer, process 726. The reverse order of deposition is also an embodiment of the invention, that is, where the CE layer is deposited first, then the IC layer and then the EC layer. In one embodiment, each of the electrochromic layer, the ion conducting layer, and the counter electrode layer is a solid phase layer. In another embodiment, each of the electrochromic layer, the ion conducting layer, and the counter electrode layer includes only inorganic material.

It should be understood that while certain embodiments are described in terms of a counter electrode layer, an ion conductor layer, and an electrochromic layer, any one or more of these layers may be composed of one or more sub-layers, which may have distinct compositions, sizes, morphologies, charge densities, optical properties, etc. Further any one or more of the device layers may have a graded composition or a graded morphology in which the composition or morphology, respectively, changes over at least a portion of the thickness of the layer. In one example, the concentration of a dopant or charge carrier varies within a given layer, at least as the layer is fabricated. In another example, the morphology of a layer varies from crystalline to amorphous. Such graded composition or morphology may be chosen to impact the functional properties of the device. In some cases, additional layers may be added to the stack.

In one example a heat spreader layer is interposed between one or both TCO layers and the EC stack.

In another example, a cathodically coloring electrochromic layer and/or an anodically coloring counter electrode layer may be deposited as two distinct sub-layers optionally having different compositions, although both sub-layers may have compositions (e.g., compositions that include electrochromic materials or compositions that include counter electrode materials) as generally described herein. Certain processing steps (e.g., lithiation) may occur between depositing the sub-layers. In a particular embodiment, counter electrode material is deposited in two sub-layers having different compositions. The first sub-layer (closer to the cathodically coloring electrochromic layer) may be anodically coloring, while the second sub-layer (farther away from the cathodically coloring electrochromic layer) may or may not be anodically coloring, or may be more weakly anodically coloring than the first sub-layer. Between deposition of the first and second sub-layers, the partially fabricated device may be subject to a lithiation operation. The second sub-layer may reduce the risk of forming defects. In some cases the second sub-layer acts as a defect-mitigating layer, and may be more electronically insulating than the first sub-layer. A further discussion of defect-mitigating layers and their properties is provided in U.S. patent application Ser. No. 13/763,505, filed Feb. 8, 2013, and titled "DEFECT-MITIGATION LAYERS IN ELECTROCHROMIC DEVICES," which is incorporated herein by reference in its entirety.

Also, as described above, the electrochromic devices of the invention utilize ion movement between the electrochromic layer and the counter electrode layer via an ion conducting layer. In some embodiments these ions (or neutral precursors thereof) are introduced to the stack as one or more layers (as described below in more detail in relation to FIGS. 7C and 7D) that eventually intercalate into the stack. In some embodiments these ions are introduced into the stack concurrently with one or more of the electrochromic layer, the ion conducting layer, and the counter electrode layer. In one embodiment, where lithium ions are used, lithium is, e.g., sputtered along with the material used to make the one or more of the stack layers or sputtered as part of a material that includes lithium (e.g., by a method employing lithium nickel tungsten oxide, optionally provided with other additives as listed herein). In one embodiment, the IC layer is deposited via sputtering a lithium silicon aluminum oxide target. In another embodiment, the Li is cosputtered along with silicon aluminum in order to achieve the desired film.

Referring again to process 722 in FIG. 7B, in one embodiment, depositing the electrochromic layer comprises depositing $WO_x$, e.g. where x is less than 3.0 and at least about 2.7. In this embodiment, the $WO_x$ has a substantially nanocrystalline morphology. In some embodiments, the electrochromic layer is deposited to a thickness of between about 200 nm and 700 nm. In one embodiment, depositing the electrochromic layer includes sputtering tungsten from a tungsten containing target. In one such embodiment, a metallic tungsten (or tungsten alloy) target is used. In another embodiment (which may also employ a metallic tungsten target) the sputter gas is an inert gas (e.g., argon or xenon) with some oxygen containing gas (e.g., molecular or atomic oxygen) present. This is part of the controlled ambient environment that may be present in a deposition chamber or a station within a larger chamber. In one embodiment, the gas composition contains between about 30% and about 100% oxygen, in another embodiment between about 50% and about 80% oxygen, in yet another embodiment between about 65% and about 75% oxygen. In one embodiment, the tungsten containing target contains between about 80% and 100% (by weight) tungsten, in another embodiment between about 95% and 100% tungsten, and in yet another embodiment between about 99% and 100% tungsten. In one embodiment, the gas composition is about 70% oxygen/30% argon and the target is metallic tungsten of a purity of between about 99% and 100%. In another embodiment a tungsten oxide W(O) ceramic target is sputtered with, e.g., argon. The pressure in the deposition station or chamber, in one embodiment, is between about 1 and about 75 mTorr, in another embodiment between about 5 and about 50 mTorr, in another embodiment between about 10 and about 20 mTorr. In one embodiment, the substrate temperature for process 722 is between about 100° C. and about 500° C., in another embodiment between about 100° C. and about 300° C., and in another embodiment between about 150° C. and about 250° C. The substrate temperature may be measured in situ by, e.g., a thermocouple such as an infra-red thermocouple (IR t/c). In one embodiment, the power density used to sputter the EC target is between about 2 Watts/cm$^2$ and about 50 Watts/cm$^2$ (determined based on the power applied divided by the surface area of the target); in another embodiment between about 10 Watts/cm$^2$ and about 20 Watts/cm$^2$; and in yet another embodiment between about 15 Watts/cm$^2$ and about 20 Watts/cm$^2$. In some embodiments, the power delivered to effect sputtering is provided via direct current (DC). In other embodiments, pulsed DC/AC reactive sputtering is used. In one embodiment, where pulsed DC/AC reactive sputtering is used, the frequency is between about 20 kHz and about 400 kHz, in another embodiment between about 20 kHz and about 50 kHz, in yet another embodiment between about 40 kHz and about 50 kHz, in another embodiment about 40 kHz. The above conditions may be used in any combination with one another to effect deposition of a high quality tungsten oxide electrochromic layer.

In one embodiment, in order to normalize the rate of deposition of tungsten, multiple targets are used so as to obviate the need for inappropriately high power (or other inappropriate adjustment to desired process conditions) to increase deposition rate. The distance between the target and the substrate may also be important. In one embodiment, the distance between the target (cathode or source) to the substrate surface is between about 35 mm and about 150 mm; in another embodiment between about 45 mm and about 130 mm; and in another embodiment between about 70 mm and about 100 mm.

It should be understood that while deposition of the EC layer is described in terms of sputtering from a target, other deposition techniques are employed in some embodiments. For example, chemical vapor deposition, atomic layer deposition, and the like may be employed. Each of these techniques, along with PVD, has its own form of material source as is known to those of skill in the art.

Referring again to FIG. 7B, operation 724, once the EC layer is deposited, the IC layer is deposited. In one embodiment, depositing the ion conducting layer includes depositing a material selected from the group consisting of a tungsten oxide, a tantalum oxide, a niobium oxide, and a silicon aluminum oxide. In another embodiment, depositing the ion conducting layer includes sputtering a target including between about 2% and 20% by weight of aluminum (remainder silicon) in an oxygen containing environment to produce a layer of silicon aluminum oxide. In a more specific embodiment, the target is between about 5% and about 10% aluminum in silicon, in another embodiment, between about 7% and about 9% aluminum in silicon. In one embodiment, the gas composition contains between about 15% and about 70% oxygen, in another embodiment between about 20% and about 50% oxygen, in yet another embodiment between about 25% and about 45% oxygen, in another embodiment about 35% oxygen. In another embodiment, depositing the ion conducting layer includes depositing the ion conducting layer to a thickness of between about 10 and 100 nm. In yet another embodiment, depositing the ion conducting layer includes depositing the ion conducting layer to a thickness of between about 20 and 50 nm. In one embodiment, the power density used to sputter the IC target is between about 1 Watts/cm$^2$ and about 20 Watts/cm$^2$ (determined based on the power applied divided by the surface area of the target); in another embodiment between about 5 Watts/cm$^2$ and about 7 Watts/cm$^2$; and in yet another embodiment between about 6 Watts/cm$^2$ and about 6.5 Watts/cm$^2$. In some embodiments, the power delivered to effect sputtering is provided via direct current (DC). In other embodiments, pulsed DC/AC reactive sputtering is used. In one embodiment, where pulsed DC/AC reactive sputtering is used, the frequency is between about 20 kHz and about 400 kHz, in another embodiment between about 20 kHz and about 50 kHz, in yet another embodiment between about 40 kHz and about 50 kHz, in another embodiment about 40 kHz. The pressure in the deposition station or chamber, in one embodiment, is between about 5 mTorr and about 40 mTorr, in another embodiment between about 10 mTorr and about 30 mTorr, in another embodiment about 20 mTorr. In one embodiment, the substrate temperature ranges for operation 724 are between about 20° C. and about 200° C., in some embodiments between about 20° C. and about 150° C., and it yet still other embodiments between about 25° C. and about 100° C. The above conditions may be used in any combination with one another to effect deposition of a high quality ion conducting layer.

Referring again to FIG. 7B, operation 726, after the IC layer is deposited, the CE layer is deposited. In one embodiment, depositing the counter electrode layer includes depositing a layer of nickel tungsten oxide (NiWO) that includes one or more additives as described above, preferably amorphous NiWO. In a specific embodiment, depositing the counter electrode layer includes sputtering a target including about 30% (by weight) to about 70% of tungsten in nickel in an oxygen containing environment to produce a layer of nickel tungsten oxide. In another embodiment the target is between about 40% and about 60% tungsten in nickel, in another embodiment between about 45% and about 55% tungsten in nickel, and in yet another embodiment about 51% tungsten in nickel. In one embodiment, the gas composition contains between about 30% and about 100% oxygen, in another embodiment between about 80% and about 100% oxygen, in yet another embodiment between about 95% and about 100% oxygen, in another embodiment about 100% oxygen. The additive(s) may be introduced via the sputter target in some cases. In these or other cases, the additive(s) may be introduced via another method, for example through evaporation, which may or may not occur concurrently with sputtering.

In one embodiment, the power density used to sputter the CE target is between about 2 Watts/cm$^2$ and about 50 Watts/cm$^2$ (determined based on the power applied divided by the surface area of the target); in another embodiment between about 5 Watts/cm$^2$ and about 20 Watts/cm$^2$; and in yet another embodiment between about 8 Watts/cm$^2$ and about 10 Watts/cm$^2$, in another embodiment about 8 Watts/cm$^2$. In some embodiments, the power delivered to effect sputtering is provided via direct current (DC). In other embodiments, pulsed DC/AC reactive sputtering is used. In one embodiment, where pulsed DC/AC reactive sputtering is used, the frequency is between about 20 kHz and about 400 kHz, in another embodiment between about 20 kHz and about 50 kHz, in yet another embodiment between about 40 kHz and about 50 kHz, in another embodiment about 40 kHz. The pressure in the deposition station or chamber, in one embodiment, is between about 1 and about 50 mTorr, in another embodiment between about 20 and about 40 mTorr, in another embodiment between about 25 and about 35 mTorr, in another embodiment about 30 mTorr.

In some cases, a nickel tungsten oxide NiWO ceramic target (which may or may not include one or more additives as described above) is sputtered with, e.g., argon and oxygen. In one embodiment, the NiWO is between about 15% (atomic) Ni and about 60% Ni; between about 10% W and about 40% W; and between about 30% O and about 75% O. In another embodiment, the NiWO is between about 30% (atomic) Ni and about 45% Ni; between about 10% W and about 25% W; and between about 35% O and about 50% O. In one embodiment, the NiWO is about 42% (atomic) Ni, about 14% W, and about 44% O. As noted, the NiWO target may also include one or more of the additives listed above. In another embodiment, depositing the counter electrode layer includes depositing the counter electrode layer to a thickness of between about 150 and 350 nm; in yet another embodiment between about 200 and about 250 nm thick. The above conditions may be used in any combination with one another to effect deposition of a high quality NiWO layer that includes one or more additives. The above conditions may also be used in any combination with one another to effect deposition of a counter electrode layer having a different composition, for example one that includes a base anodically coloring electrochromic material and one or more additives as described above. Although much of the description focuses on embodiments where the base anodically coloring material is nickel oxide and the additive is or includes tungsten, other materials may also be used. Details herein regarding nickel in the counter electrode may also apply to other metals used in a base anodically coloring material. Details herein regarding tungsten in the counter electrode may also apply to other additives, alone or in combination, as listed herein.

In another embodiment, operation 726 of FIG. 7B includes depositing a counter electrode layer including at least one base anodically coloring electrochromic material containing at least one metal selected from the group consisting of chromium, manganese, iron, cobalt, nickel, rhodium, ruthenium, vanadium, and iridium, or selected from the group consisting of chromium, manganese, iron, cobalt, nickel, rhodium, and iridium, or selected from the group consisting of nickel and iridium. The metal may be provided as an oxide. Where the CE layer is deposited through sputtering, the sputter target may include one or more metals (or oxides thereof) selected from the group consisting of chromium, manganese, iron, cobalt, nickel, rhodium, ruthenium, vanadium, and iridium, or from the group consisting of chromium, manganese, iron, cobalt, nickel, rhodium, and iridium, or from the group consisting of nickel and iridium. In these or other cases, depositing the counter electrode layer may include depositing one or more additives/additional materials as part of the layer. The additive material may be selected from the group consisting of silver (Ag), arsenic (As), gold (Au), boron (B), cadmium (Cd), cesium (Cs), copper (Cu), europium (Eu), gallium (Ga), gadolinium (Gd), germanium (Ge), mercury (Hg), osmium (Os), lead (Pb), palladium (Pd), promethium (Pm), polonium (Po), platinum (Pt), radium (Ra), rubidium (Rb), terbium (Tb), technetium (Tc), thorium (Th), and thallium (Tl), or from any of the sub-groups identified herein. For instance, in certain cases the additional material is selected from the group consisting of germanium, gadolinium, gallium and copper, or the group consisting of germanium, gadolinium and gallium, or the group consisting of germanium and copper. The additional material may be provided through sputtering, for example with a sputter target including one or more of the additional materials, or an oxide of one or more of the additional materials.

The sputtering process for forming the CE layer may utilize one or more sputter targets. Where one sputter target is used, it may include both the anodically coloring electrochromic material and the additive (either or both provided in oxide form on the target). The sputter target may include a grid or other overlapping shape where different portions of the grid include the different relevant materials. In other cases, the sputter target may be an alloy of the relevant materials. Where two sputter targets are used, each sputter target may include one of the relevant materials (e.g., the anodically coloring electrochromic material or the additive, either or both in oxide form). The sputter targets may overlap in some cases. As noted, the counter electrode layer is typically an oxide material. Oxygen may be provided as a part of the sputter target. In other cases, the sputter targets are substantially pure metals, and sputtering is done in the presence of oxygen to form the oxide.

In one embodiment, in order to normalize the rate of deposition of the CE layer, multiple targets are used so as to obviate the need for inappropriately high power (or other inappropriate adjustment to desired process conditions) to increase deposition rate. In one embodiment, the distance between the CE target (cathode or source) to the substrate surface is between about 35 mm and about 150 mm; in another embodiment between about 45 mm and about 130 mm; and in another embodiment between about 70 mm and about 100 mm.

It should be understood that while the order of deposition operations is depicted in FIG. 7B (and implied in FIG. 6A) to be first EC layer, second IC layer, and finally CE layer, the order can be reversed in various embodiments. In other words, when as described herein "sequential" deposition of the stack layers is recited, it is intended to cover the following "reverse" sequence, first CE layer, second IC layer, and third EC layer, as well the "forward" sequence described above. Both the forward and reverse sequences can function as reliable high-quality electrochromic devices. Further, it should be understood that conditions recited for depositing the various EC, IC, and CE materials recited here, are not limited to depositing such materials. Other materials may, in some cases, be deposited under the same or similar conditions. Further, non-sputtering deposition conditions may be employed in some embodiments to create the same or similar deposited materials as those described in the context of FIGS. 6A-6B and FIGS. 7A-7E.

Since the amount of charge each of the EC and the CE layers can safely hold varies, depending on the material used, the relative thickness of each of the layers may be controlled to match capacity as appropriate. In one embodiment, the electrochromic layer includes tungsten oxide and the counter electrode includes nickel tungsten oxide (with one or more additives as described herein), and the ratio of thicknesses of the electrochromic layer to the counter electrode layer is between about 1.7:1 and 2.3:1, or between about 1.9:1 and 2.1:1 (with about 2:1 being a specific example). Such thickness ratios may also be used where the counter electrode is made of a different material.

Referring again to FIG. 7B, operation 720, after the CE layer is deposited, the EC stack is complete. It should be noted that in FIG. 7A, process operation 720 which refers to "depositing stack" means in this context, the EC stack plus the second TCO layer (sometimes referred to as the "ITO" when indium tin oxide is used to make the second TCO). Generally "stack" in this description refers to the EC-IC-CE layers; that is, the "EC stack." Referring again to FIG. 7B, in one embodiment, represented by process 728, a TCO layer is deposited on the stack. Referring to FIG. 6A, this would correspond to second TCO layer 630 on EC stack 625. Process flow 720 is finished once process 728 is complete. Typically, but not necessarily, a capping layer is deposited on the EC stack. In some embodiments, the capping layer is SiAlO, similar to the IC layer. In some embodiments, the capping layer is deposited by sputtering, similar to the conditions under which the IC layer is deposited. The thickness of a capping layer is typically about 30 nm to 100 nm. In one embodiment, depositing the layer of transparent conductive oxide is performed under conditions whereby the transparent conductive oxide has a sheet resistance of between about 10 and 30 ohms/square. In one embodiment as discussed above, the first and second TCO layers are of matched sheet resistance for optimum efficiency of the electrochromic device. Ideally the first TCO layer's morphology should be smooth for better conformal layers in the deposited stack. In one embodiment, a substantially uniform TCO layer varies only about ±10% in each of the aforementioned thickness ranges. In another embodiment, a substantially uniform TCO layer varies only about ±5% in each of the aforementioned thickness ranges. In another embodiment, a substantially uniform TCO layer varies only about ±2% in each of the aforementioned thickness ranges.

In certain specific embodiments, the second TCO layer 630 is deposited using some or all of the following conditions. The recited conditions may be employed to form a thin, low-defect layer of indium tin oxide by sputtering a target containing indium oxide in tin oxide, e.g. with an argon sputter gas with or without oxygen. In one embodiment, the thickness of the TCO layer is between about 5 nm and about 10,000 nm, in another embodiment between about 10 nm and about 1,000 nm. In yet another embodiment this thickness is between about 10 nm and about 500 nm. In one embodiment, the substrate temperature for operation 728 is between about 20 and about 300° C., in another embodiment between about 20 and about 250° C., and in another embodiment between about 80 and about 225° C. In one embodiment, depositing the TCO layer includes sputtering a target including between about 80% (by weight) to about 99% of $In_2O_3$ and between about 1% and about 20% $SnO_2$ using an inert gas, optionally with oxygen. In a more specific embodiment, the target is between about 85% (by weight) to about 97% of $In_2O_3$ and between about 3% and about 15% $SnO_2$. In another embodiment, the target is about 90% of $In_2O_3$ and about 10% $SnO_2$. In one embodiment, the gas composition contains between about 0.1% and about 3% oxygen, in another embodiment between about 0.5% and about 2% oxygen, in yet another embodiment between about 1% and about 1.5% oxygen, in another embodiment about 1.2% oxygen. In one embodiment, the power density used to sputter the TCO target is between about 0.5 Watts/cm$^2$ and about 10 Watts/cm$^2$ (determined based on the power applied divided by the surface area of the target); in another embodiment between about 0.5 Watts/cm$^2$ and about 2 Watts/cm$^2$;

and in yet another embodiment between about 0.5 Watts/cm² and about 1 Watts/cm², in another embodiment about 0.7 Watts/cm². In some embodiments, the power delivered to effect sputtering is provided via direct current (DC). In other embodiments, pulsed DC/AC reactive sputtering is used. In one embodiment, where pulsed DC/AC reactive sputtering is used, the frequency is between about 20 kHz and about 400 kHz, in another embodiment between about 50 kHz and about 100 kHz, in yet another embodiment between about 60 kHz and about 90 kHz, in another embodiment about 80 kHz. The pressure in the deposition station or chamber, in one embodiment, is between about 1 and about 10 mTorr, in another embodiment between about 2 and about 5 mTorr, in another embodiment between about 3 and about 4 mTorr, in another embodiment about 3.5 mTorr. In one embodiment, the indium tin oxide layer is between about 20% (atomic) In and about 40% In; between about 2.5% Sn and about 12.5% Sn; and between about 50% O and about 70% O; in another embodiment, between about 25% In and about 35% In; between about 5.5% Sn and about 8.5% Sn; and between about 55% O and about 65% O; and in another embodiment, about 30% In, about 8% Sn; and about 62% O. The above conditions may be used in any combination with one another to effect deposition of a high quality indium tin oxide layer.

As mentioned, the EC stack is fabricated in an integrated deposition system where the substrate does not leave the integrated deposition system at any time during fabrication of the stack. In one embodiment, the second TCO layer is also formed using the integrated deposition system where the substrate does not leave the integrated deposition system during deposition of the EC stack and the TCO layer. In one embodiment, all of the layers are deposited in the integrated deposition system where the substrate does not leave the integrated deposition system during deposition; that is, in one embodiment the substrate is a glass sheet and a stack including the EC layer, the IC layer and the CE layer, sandwiched between a first and a second TCO layer, is fabricated on the glass where the glass does not leave the integrated deposition system during deposition. In another implementation of this embodiment, the substrate is glass with a diffusion barrier deposited prior to entry in the integrated deposition system. In another implementation the substrate is glass and the diffusion barrier, a stack including the EC layer, the IC layer and the CE layer, sandwiched between a first and a second TCO layer, are all deposited on the glass where the glass does not leave the integrated deposition system during deposition.

While not wishing to be bound by theory, it is believed that prior art electrochromic devices suffered from high defectivity for various reasons, one of which is the integration of unacceptably high numbers of particles into the IC layer during fabrication. Care was not taken to ensure that each of the EC layer, IC layer, and CE layer were deposited in a single integrated deposition apparatus under a controlled ambient environment. In one process, the IC layer is deposited by a sol gel process, which is necessarily performed apart from other vacuum integrated processes. In such process, even if the EC layer and/or the CE layer are deposited in a controlled ambient environment, thereby promoting high quality layers, the substrate would have to be removed from the controlled ambient environment to deposit the IC layer. This would normally involve passing the substrate through a load lock (from vacuum or other controlled ambient environment to an external environment) prior to formation of the IC layer. Passage through a load lock typically introduces numerous particles onto the substrate. Introducing such particles immediately before the IC layer is deposited greatly increases the likelihood that defects will form in the critical IC layer. Such defects lead to bright spots or constellations as discussed above.

As mentioned above, lithium may be provided with the EC, CE and/or IC layers as they are formed on the substrate. This may involve, for example, co-sputtering of lithium together with the other materials of a given layer (e.g., tungsten and oxygen). In certain embodiments described below the lithium is delivered via a separate process and allowed to diffuse or otherwise incorporate into the EC, CE and/or IC layers.

In some embodiments, the electrochromic stack includes a counter electrode layer in direct physical contact with an electrochromic layer, without an ion conducting layer in between. The electrochromic and/or counter electrode layer may include an oxygen-rich portion in contact with the other of these layers. The oxygen-rich portion includes the electrochromic material or counter electrode material, with a higher concentration of oxygen than in the remaining portion of the electrochromic layer and/or counter electrode layer. Electrochromic devices fabricated according to such a design are further discussed and described in U.S. Pat. No. 8,300,298, filed Apr. 30, 2010, which is herein incorporated by reference in its entirety.

Direct Lithiation of the Electrochromic Stack

In some embodiments, as mentioned above, intercalation of lithium ions is responsible for switching the optical state of an electrochromic device stack. It should be understood that the needed lithium may be introduced to the stack by various means. For example, lithium may be provided to one or more of these layers concurrently with the deposition of the material of the layer (e.g., concurrent deposition of lithium and tungsten oxide during formation of the EC layer). In some cases, however, the process of FIG. 7B may be punctuated with one or more operations for delivering lithium to the EC layer, the IC layer, and/or the CE layer. For example, lithium may also be introduced via one or more separate lithiation steps in which elemental lithium is delivered without substantial deposition of other material. Such lithiation step(s) may take place after deposition of the EC layer, the IC layer, and/or the CE layer. Alternatively (or in addition), one or more lithiation steps may take intermediate between steps performed to deposit a single layer. For example, a counter electrode layer may be deposited by first depositing a limited amount of counter electrode material, followed by directly depositing lithium, and then concluded by depositing additional counter electrode material. Such approaches may have certain advantages such as better separating the lithium from the ITO (or other material of a conductive layer) which improves adhesion and prevents undesirable side reactions. One example of a stack formation process employing a separate lithiation operation is presented in FIG. 7C. In certain cases, the lithiation operation(s) takes place during while the deposition of a given layer is temporarily halted to allow lithium to be introduced before deposition of the layer is completed.

FIG. 7C depicts a process flow, 720a, for depositing the stack onto a substrate in a manner analogous to process 720 of FIG. 7A. Process flow 720a includes depositing an EC layer, operation 722, depositing an IC layer, operation 724, and depositing a CE layer, operation 726, as described in relation to FIG. 7B. However, process flow 720a differs from 720 by the addition of lithiation operations 723 and 727. In one embodiment, the lithium is physical vapor deposited using an integrated deposition system where the substrate does not leave the integrated deposition system at any time during the sequential deposition of the electrochromic layer, the ion conducting layer, the counter electrode layer, and the lithium.

In certain embodiments, lithium is deposited using a high voltage lithium cathode since there are not many secondary electron emissions during lithium sputtering. In some embodiments, the power delivered to effect sputtering is provided via direct current (DC). In other embodiments, pulsed DC/AC reactive sputtering is used. In one embodiment, where pulsed DC/AC reactive sputtering is used, the frequency is between about 20 kHz and about 400 kHz, in another embodiment between about 100 kHz and about 300 kHz, in yet another embodiment between about 200 kHz and about 250 kHz, in another embodiment about 220 kHz. A lithium target is used. In one embodiment the target is between about 80% (by weight) and 100% Li, in another embodiment between about 90% and about 99% Li, in another embodiment about 99% Li. Typically, due to the extreme reactivity of elemental lithium, lithiation is performed in an inert environment (e.g., argon alone). The power density used to sputter the lithium target is between about 1 Watts/cm$^2$ and about 10 Watts/cm$^2$ (determined based on the deposition surface area of the substrate); in another embodiment between about 2 Watts/cm$^2$ and about 4 Watts/cm$^2$; in yet another embodiment between about 2.5 Watts/cm$^2$ and about 3 Watts/cm$^2$; in another embodiment about 2.7 Watts/cm$^2$. In one embodiment the lithium sputtering is done at a pressure of between about 1 and about 20 mTorr, in another embodiment between about 5 and about 15 mTorr, in another embodiment about 10 mTorr. The above conditions may be used in any combination with one another to effect deposition of a high quality lithiation process.

In one embodiment, lithium is deposited on both the EC layer and the CE layer as depicted in dual lithiation process 720a. After the EC layer is deposited as described above, operation 722, lithium is sputtered on the EC layer; see operation 723. Thereafter, the IC layer is deposited, operation 724, followed by the CE layer, operation 726. Then lithium is deposited on the CE layer; see operation 727. In one embodiment where, e.g., the EC layer is tungsten oxide and about twice as thick as a CE layer, the total amount of lithium added to the stack is proportioned between the EC layer and the CE layer in a ratio of about 1:3 to 2:3; that is, the EC layer is sputtered with ⅓ of the total lithium and the CE layer with about ⅔ of the total lithium added to the stack. In a specific embodiment, the lithium added to the stack is proportioned between the EC layer and the CE layer in a ratio of about 1:2.

In the depicted dual lithiation method, both the EC layer and the CE layer are lithiated. Without wishing to be bound by theory, it is believed that by delivering lithium to both the EC layer and the CE layer, performance and yield are improved. The relatively large volume change due to insertion of lithium ions into a depleted layer (as fabricate) during initial equilibration (from a single lithiation on one side of the IC layer) is avoided. These volume changes, which are reported to be as large as 6% in electrochromically active tungsten oxide initially devoid of lithium, can produce cracking and delamination of the stack layers. Therefore, improvements can be realized by fabricating the stack with a dual lithiation process as described herein, which results in less than 6% volume change in the electrochromic layer. In certain embodiments, the volume change is at most about 4%.

In one embodiment of the dual lithiation method, as explained above, the EC layer is treated with sufficient lithium to satisfy the requirements of the EC material irreversibly bound lithium (to, e.g., compensate "blind charge"). The lithium needed for reversible cycling is added to the CE layer (which also may have a blind charge). In certain embodiments, the lithium needed to compensate the blind charge can be titrated by monitoring optical density of the EC layer as lithium is added since the EC layer will not substantially change color until sufficient lithium has been added to fully compensate the blind charge.

One of ordinary skill in the art would appreciate that because metallic lithium is pyrophoric, i.e. highly reactive with moisture and oxygen, that lithiation methods described herein where lithium might be exposed to oxygen or moisture are performed either under vacuum, inert atmosphere or both. The controlled ambient environment of apparatus and methods of the invention provides flexibility in lithium depositions, particularly where there are multiple lithiation steps. For example, where lithiation is performed in a titration process and/or among multiple steps in a stack layering, the lithium can be protected from exposure to oxygen or moisture.

In certain embodiments, the lithiation is performed at a rate sufficient to prevent formation of a substantial thickness of free lithium on the EC layer surface. In one embodiment, during lithiation of the EC layer, lithium targets are spaced sufficiently to give time for lithium to diffuse into the EC layer. Optionally, the substrate (and hence the EC layer) is heated to between about 100° C. and about 150° C. to enhance diffusion of lithium into the EC layer. Heating may be done separately or in combination with target spacing and substrate translation past the target(s). In some cases, the substrate is moved back and forth in front of a sputtered lithium target in order to slow the delivery of lithium to the substrate and prevent accumulation of free metallic lithium on the stack surface.

In some cases, the lithiation processes are performed with isolation protocols in place. In one example, isolation protocols are performed with isolation valves within the integrated deposition system. For example, once a substrate is moved into a lithiation station, isolation valves shut to cut off the substrate from other stations and for example, flush with argon or evacuate to prepare for the lithiation. In another embodiment, the isolation is achieved by manipulating the controlled ambient environment, e.g., by creating a flow dynamic in the controlled ambient environment via differential pressures in a lithiation station of the integrated deposition system such that the lithium deposition is sufficiently isolated from other processes in the integrated deposition system. In another embodiment, a combination of the aforementioned conditions are used. For example valves can partially close (or the lithiation station can be configured so that the substrate entry and/or exit ports are minimized) and one or more flow dynamics are used to further isolate the lithiation process from adjoining processes. Referring again to FIG. 7C, after the dual lithiation process as described in operations 722-727, the (second) TCO layer is deposited (operation 728) as described above.

FIG. 7D depicts another process flow, 720b, for depositing the stack onto a substrate. The process is analogous to process flow 700 of FIG. 7A. Process flow 720b includes depositing an EC layer (operation 722) depositing an IC layer (operation 724) and depositing a CE layer (operation 726) as described in relation to FIG. 7B. However, process flow 720b differs from 720 because there is an intervening lithiation operation 727. In this embodiment of the process of stack deposition, all the required lithium is added by delivering lithium to the CE layer and allowing the lithium to intercalate into the EC layer via diffusion through the IC layer during and/or after stack fabrication. As mentioned, this may not avoid larger volume changes associated with loading all the required lithium for the device on one side of the IC layer, as the dual lithiation process 720a does, but it has the advantage of having one less lithium delivery step.

In certain embodiments, lithiation may occur through a particular method involving sustained self-sputtering. Such methods are further described in P.C.T. Patent Application No. PCT/US14/35358, filed Apr. 24, 2014, and titled "SUSTAINED SELF-SPUTTERING OF LITHIUM FOR LITHIUM PHYSICAL VAPOR DEPOSITION," which is herein incorporated by reference in its entirety.

Multistep Thermochemical Conditioning

Referring again to FIG. 7A, once the stack is deposited, the device is subjected to a multistep thermo-chemical conditioning (MTC) process (see block 730). Typically, the MTC process is performed only after all layers of the electrochromic stack have been formed. Some embodiments of the MTC process 730 are depicted in more detail in FIG. 7E. Note that the MTC process can be conducted entirely ex situ, i.e., outside of the integrated deposition system used to deposit the stack, or at least partially in situ, i.e., inside the deposition system without e.g. breaking vacuum or otherwise moving the substrate outside the controlled ambient environment used to fabricate the stack. In certain embodiments, the initial portions of the MTC process are performed in situ, and later portions of the process are performed ex situ. In certain embodiments, portions of the MTC are performed prior to deposition of certain layers, for example, prior to deposition of the second TCO layer.

Referring to FIG. 7E, and in accordance with certain embodiments, the device is first thermally treated under non-reactive conditions (e.g., under an inert gas). See block 732. In a specific embodiment, the device is heated at a temperature of between about 200° C. and about 350° C. for between about 5 minutes and about 30 minutes. In certain embodiments, operation 732 is conducted at low pressure or vacuum. Without wishing to be bound by theory, it is believed that inert gas heating moves any excess lithium from the EC layer to the CE layer, thus charging the CE layer with lithium (as indicated in some cases by the CE layer's transparency increasing during this process). Next, the device is subjected to a thermal treatment under reactive conditions. See block 734. In some embodiments, this involves annealing the device in an oxidizing atmosphere (e.g., oxygen and inert gas at about 10-50 mTorr). In specific embodiments, the anneal is conducted at higher pressures than the non-reactive thermal processing step (732). In a specific embodiment, the device is heated at a temperature of between about 200° C. and about 350° C. for between about 3 minutes and about 20 minutes. While not wishing to be bound to theory, it is believed that the oxidative anneal process improves the conductivity of the NiWO-based counter electrode (which may include one or more additives as described above) by forming a matrix of $Li_2WO_4$ (which is a very good lithium ion conductor) that encapsulates individual NiWO grains. NiWO embedded in a highly ionically conductive matrix facilitates rapid optical transitions.

Optionally, after the oxidative anneal, the device is heated in air (ex situ). In one embodiment, the device is heated at between about 150° C. and about 500° C. for between about 1 minutes and about 60 minutes, in another embodiment at between about 200° C. and about 400° C. for between about 5 minutes and about 30 minutes, process 736. It should be understood that the MTC process may include two, three, or more separate and distinct operations. The three operations described here are provided solely for purposes of exemplifying the process. Further, the process conditions presented here are appropriate for architectural glass, but may have to be scaled for other applications, recognizing that the time to heat a device is dependent upon the size of the device. After the MTC process is complete, the device is ready for further processing.

As mentioned above, additional layers may be needed for improved optical performance (e.g. anti-reflectives), durability (due to physical handling), hermeticity, and the like. Addition of one or more of these layers is meant to be included in additional embodiments to those described above.

Fabrication Process for Completion of the Device

Again referring to FIG. 7A, a second laser scribe (block 740) is performed. Laser scribe 740 is performed across the length of the substrate near the outer edge of the stack, on the two sides of the substrate perpendicular to the first laser scribe. FIG. 6B shows the location of the trenches, 626, formed by laser scribe 740. This scribe is also performed all the way through the first TCO (and diffusion barrier if present) to the substrate in order to further isolate the isolated portion of the first TCO layer (where the first bus bar will be connected) and to isolate the stack coating at the edges (e.g. near a mask) to minimize short circuits due to deposition roll off of the stack layers. In one embodiment, the trench is between about 25 µm and 75 µm deep and between about 100 µm and 300 µm wide. In another embodiment, the trench is between about 35 µm and 55 µm deep and between about 150 µm and 250 µm wide. In another embodiment, the trench is about 50 µm deep and about 150 µm wide.

Next, a third laser scribe, 745, is performed along the perimeter of the stack near the edge of the substrate opposite the first laser scribe and parallel to the first laser scribe. This third laser scribe is only deep enough to isolate the second TCO layer and the EC stack, but not cut through the first TCO layer. Referring to FIG. 6A, laser scribe 745 forms a trench, 635, which isolates the uniform conformal portions EC stack and second TCO from the outermost edge portions which can suffer from roll off (e.g. as depicted in FIG. 6A, the portion of layers 625 and 630 near area 650 isolated by cutting trench 635) and thus cause shorts between the first and second TCO layers in region 650 near where the second bus bar will be attached. Trench 635 also isolates roll off regions of the second TCO from the second bus bar. Trench 635 is also depicted in FIG. 6B. One of ordinary skill in the art would appreciate that laser scribes 2 and 3, although scribed at different depths, could be done in a single process whereby the laser cutting depth is varied during a continuous path around the three sides of the substrate as described. First at a depth sufficient to cut past the first TCO (and optionally the diffusion barrier) along a first side perpendicular to the first laser scribe, then at a depth sufficient only to cut through to the bottom of the EC stack along the side opposite and parallel to the first laser scribe, and then again at the first depth along the third side, perpendicular to the first laser scribe.

Referring again to process 700, in FIG. 7A, after the third laser scribe, the bus bars are attached, process 750. Referring to FIG. 6A, bus bar 1, 640, and bus bar 2, 645, are attached. Bus bar 1 is often pressed through the second TCO and EC stack to make contact with the second TCO layer, for example via ultrasonic soldering. This connection method necessitates the laser scribe processes used to isolate the region of the first TCO where bus bar 1 makes contact. Those of ordinary skill in the art will appreciate that other means of connecting bus bar 1 (or replacing a more conventional bus bar) with the second TCO layer are possible, e.g., screen and lithography patterning methods. In one embodiment, electrical communication is established with the device's transparent conducting layers via silk screening (or using another patterning method) a conductive ink followed by heat curing or sintering the ink. When such methods are used, isolation of a portion of the first TCO layer is avoided. By using process flow 700, an electrochromic device is formed on a glass substrate where the first bus bar is in electrical communication with second TCO layer 630 and the second bus bar is in electrical contact with first TCO layer 615. In this way, the first and second TCO layers serve as electrodes for the EC stack.

Referring again to FIG. 7A, after the bus bars are connected, the device is integrated into an IGU, process 755. The IGU is formed by placing a gasket or seal (e.g. made of PVB (polyvinyl butyral), PIB or other suitable elastomer) around the perimeter of the substrate. Typically, but not necessarily, a desiccant is included in the IGU frame or spacer bar during assembly to absorb any moisture. In one embodiment, the seal surrounds the bus bars and electrical leads to the bus bars extend through the seal. After the seal is in place, a second sheet of glass is placed on the seal and the volume produced by the substrate, the second sheet of glass and the seal is filled with inert gas, typically argon. Once the IGU is complete, process 700 is complete. The completed IGU can be installed in, for example, a pane, frame or curtain wall and connected to a source of electricity and a controller to operate the electrochromic window.

In addition to the process steps described in relation to the methods above, an edge deletion step or steps may be added to the process flow. Edge deletion is part of a manufacturing process for integrating the electrochromic device into, e.g. a window, where the roll off (as described in relation to FIG. 6A) is removed prior to integration of the device into the window. Where unmasked glass is used, removal of the coating that would otherwise extend to underneath the IGU frame (undesirable for long term reliability) is removed prior to integration into the IGU. This edge deletion process is meant to be included in the methods above as an alternative embodiment to those listed above.

Integrated Deposition System

As explained above, an integrated deposition system may be employed to fabricate electrochromic devices on, for example, architectural glass. As described above, the electrochromic devices are used to make IGUs which in turn are used to make electrochromic windows. The term "integrated deposition system" means an apparatus for fabricating electrochromic devices on optically transparent and translucent substrates. The apparatus has multiple stations, each devoted to a particular unit operation such as depositing a particular component (or portion of a component) of an electrochromic device, as well as cleaning, etching, and temperature control of such device or portion thereof. The multiple stations are fully integrated such that a substrate on which an electrochromic device is being fabricated can pass from one station to the next without being exposed to an external environment. Integrated deposition systems of the invention operate with a controlled ambient environment inside the system where the process stations are located. A fully integrated system allows for better control of interfacial quality between the layers deposited. Interfacial quality refers to, among other factors, the quality of the adhesion between layers and the lack of contaminants in the interfacial region. The term "controlled ambient environment" means a sealed environment separate from an external environment such as an open atmospheric environment or a clean room. In a controlled ambient environment at least one of pressure and gas composition is controlled independently of the conditions in the external environment. Generally, though not necessarily, a controlled ambient environment has a pressure below atmospheric pressure; e.g., at least a partial vacuum. The conditions in a controlled ambient environment may remain constant during a processing operation or may vary over time. For example, a layer of an electrochromic device may be deposited under vacuum in a controlled ambient environment and at the conclusion of the deposition operation, the environment may be backfilled with purge or reagent gas and the pressure increased to, e.g., atmospheric pressure for processing at another station, and then a vacuum reestablished for the next operation and so forth.

In one embodiment, the system includes a plurality of deposition stations aligned in series and interconnected and operable to pass a substrate from one station to the next without exposing the substrate to an external environment. The plurality of deposition stations comprise (i) a first deposition station containing a target for depositing an electrochromic layer; (ii) a second deposition station containing a target for depositing an ion conducting layer; and (iii) a third deposition station containing a target for depositing a counter electrode layer. The system also includes a controller containing program instructions for passing the substrate through the plurality of stations in a manner that sequentially deposits on the substrate (i) an electrochromic layer, (ii) an ion conducting layer, and (iii) a counter electrode layer to form a stack in which the ion conducting layer separates the electrochromic layer and the counter electrode layer. In one embodiment, the plurality of deposition stations are operable to pass a substrate from one station to the next without breaking vacuum. In another embodiment, the plurality of deposition stations are configured to deposit the electrochromic layer, the ion conducting layer, and the counter electrode layer on an architectural glass substrate. In another embodiment, the integrated deposition system includes a substrate holder and transport mechanism operable to hold the architectural glass substrate in a vertical orientation while in the plurality of deposition stations. In yet another embodiment, the integrated deposition system includes one or more load locks for passing the substrate between an external environment and the integrated deposition system. In another embodiment, the plurality of deposition stations include at least two stations for depositing a layer selected from the group consisting of the electrochromic layer, the ion conducting layer, and the counter electrode layer. Further details regarding the deposition system and a mechanism for supporting the substrate during deposition are discussed in P.C.T. Patent Application No. PCT/US14/41569, filed Jun. 9, 2014, and titled "GLASS PALLET FOR SPUTTERING SYSTEMS," which is herein incorporated by reference in its entirety.

In some embodiments, the integrated deposition system includes one or more lithium deposition stations, each including a lithium containing target. In one embodiment, the integrated deposition system contains two or more lithium deposition stations. In one embodiment, the integrated deposition system has one or more isolation valves for isolating individual process stations from each other during operation. In one embodiment, the one or more lithium deposition stations have isolation valves. In this document, the term "isolation valves" means devices to isolate depositions or other processes being carried out in one station from processes at other stations in the integrated deposition system. In one example, isolation valves are physical (solid) isolation valves within the integrated deposition system that engage while the lithium is deposited. Actual physical solid valves may engage to totally or partially isolate (or shield) the lithium deposition from other processes or stations in the integrated deposition system. In another embodiment, the isolation valves may be gas knifes or shields, e.g., a partial pressure of argon or other inert gas is passed over areas between the lithium deposition station and other stations to block ion flow to the other stations. In another example, isolation valves may be evacuated regions between the lithium deposition station and other process stations, so that lithium ions or ions from other stations entering the evacuated region are removed to, e.g., a waste stream rather than contaminating adjoining processes. This is achieved, e.g., via a flow dynamic in the controlled ambient environment via differential pressures in a lithiation station of the integrated deposition system such that the lithium deposition is sufficiently isolated from other processes in the integrated deposition system. Again, isolation valves are not limited to lithium deposition stations.

Figure 8A:
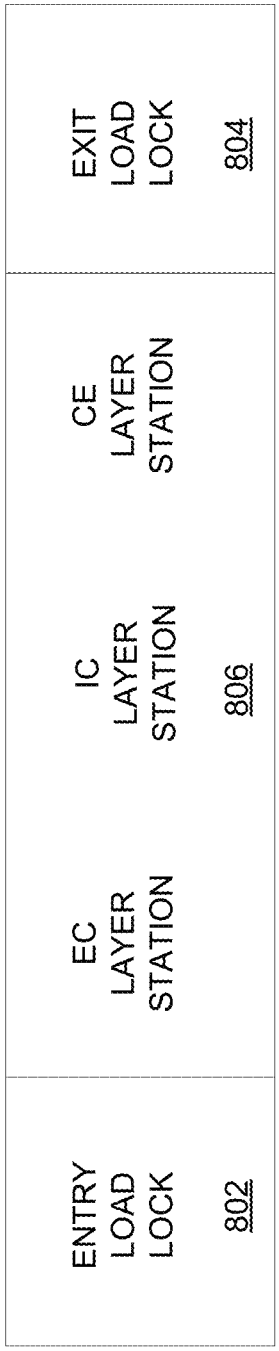
FIG. 8A, depicts an integrated deposition system of the invention.

FIG. 8A, depicts in schematic fashion an integrated deposition system 800 in accordance with certain embodiments. In this example, system 800 includes an entry load lock, 802, for introducing the substrate to the system, and an exit load lock, 804, for removal of the substrate from the system. The load locks allow substrates to be introduced and removed from the system without disturbing the controlled ambient environment of the system. Integrated deposition system 800 has a module, 806, with a plurality of deposition stations; an EC layer deposition station, an IC layer deposition station and a CE layer deposition station. In the broadest sense, integrated deposition systems of the invention need not have load locks, e.g. module 806 could alone serve as the integrated deposition system. For example, the substrate may be loaded into module 806, the controlled ambient environment established and then the substrate processed through various stations within the system. Individual stations within an integrated deposition systems can contain heaters, coolers, various sputter targets and means to move them, RF and/or DC power sources and power delivery mechanisms, etching tools e.g. plasma etch, gas sources, vacuum sources, glow discharge sources, process parameter monitors and sensors, robotics, power supplies, and the like.

Figure 8C:
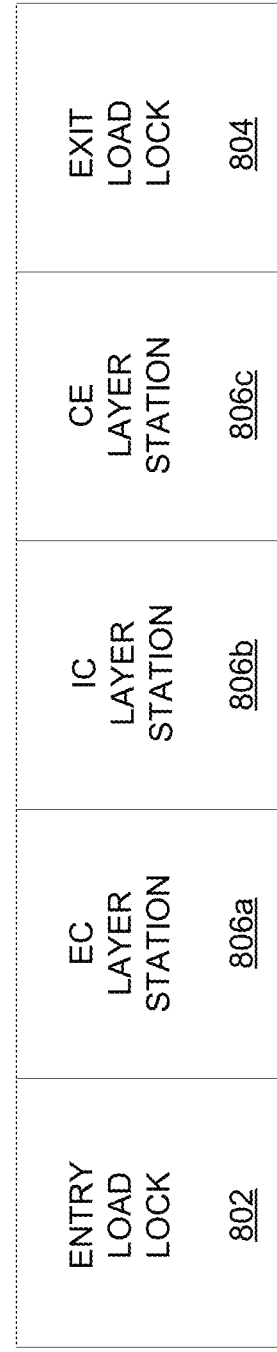
FIG. 8C depicts a modular integrated deposition system.
Figure 8B:
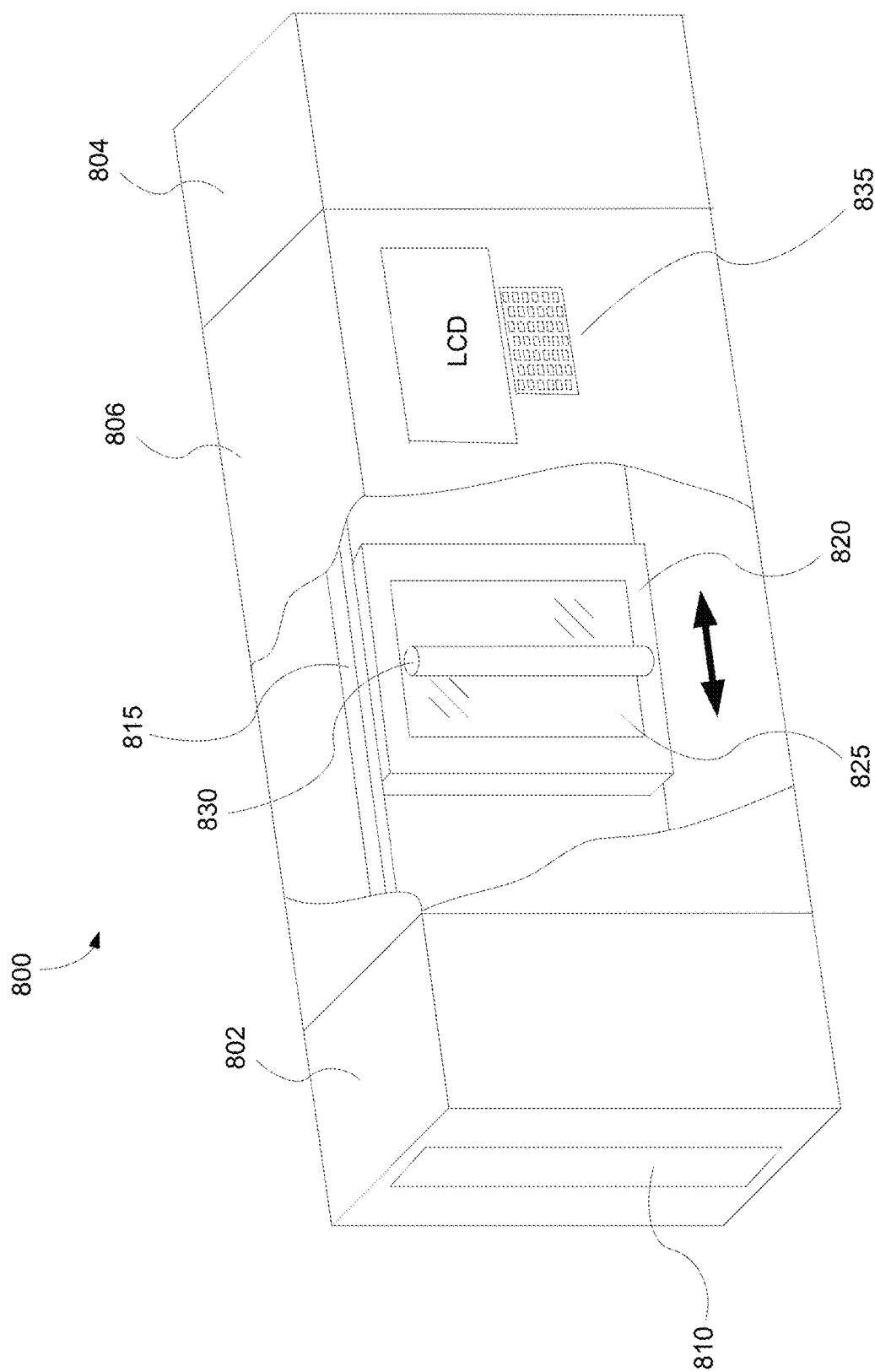
FIG. 8B depicts an integrated deposition system in a perspective view.

FIG. 8B depicts a segment (or simplified version) of integrated deposition system 800 in a perspective view and with more detail including a cutaway view of the interior. In this example, system 800 is modular, where entry load lock 802 and exit load lock 804 are connected to deposition module 806. There is an entry port, 810, for loading, for example, architectural glass substrate 825 (load lock 804 has a corresponding exit port). Substrate 825 is supported by a pallet, 820, which travels along a track, 815. In this example, pallet 820 is supported by track 815 via hanging but pallet 820 could also be supported atop a track located near the bottom of apparatus 800 or a track, e.g. mid-way between top and bottom of apparatus 800. Pallet 820 can translate (as indicated by the double headed arrow) forward and/or backward through system 800. For example during lithium deposition, the substrate may be moved forward and backward in front of a lithium target, 830, making multiple passes in order to achieve a desired lithiation. Pallet 820 and substrate 825 are in a substantially vertical orientation. A substantially vertical orientation is not limiting, but it may help to prevent defects because particulate matter that may be generated, e.g., from agglomeration of atoms from sputtering, will tend to succumb to gravity and therefore not deposit on substrate 825. Also, because architectural glass substrates tend to be large, a vertical orientation of the substrate as it traverses the stations of the integrated deposition system enables coating of thinner glass substrates since there is less concern over sag that occurs with thicker hot glass.

Target 830, in this case a cylindrical target, is oriented substantially parallel to and in front of the substrate surface where deposition is to take place (for convenience, other sputter means are not depicted here). Substrate 825 can translate past target 830 during deposition and/or target 830 can move in front of substrate 825. The movement path of target 830 is not limited to translation along the path of substrate 825. Target 830 may rotate along an axis through its length, translate along the path of the substrate (forward and/or backward), translate along a path perpendicular to the path of the substrate, move in a circular path in a plane parallel to substrate 825, etc. Target 830 need not be cylindrical, it can be planar or any shape necessary for deposition of the desired layer with the desired properties. Also, there may be more than one target in each deposition station and/or targets may move from station to station depending on the desired process.

Integrated deposition system 800 also has various vacuum pumps, gas inlets, pressure sensors and the like that establish and maintain a controlled ambient environment within the system. These components are not shown, but rather would be appreciated by one of ordinary skill in the art. System 800 is controlled, e.g., via a computer system or other controller, represented in FIG. 8B by an LCD and keyboard, 835. One of ordinary skill in the art would appreciate that embodiments of the present invention may employ various processes involving data stored in or transferred through one or more computer systems. Embodiments of the present invention also relate to the apparatus, such computers and microcontrollers, for performing these operations. These apparatus and processes may be employed to deposit electrochromic materials of methods of the invention and apparatus designed to implement them. The control apparatus of this invention may be specially constructed for the required purposes, or it may be a general-purpose computer selectively activated or reconfigured by a computer program and/or data structure stored in the computer. The processes presented herein are not inherently related to any particular computer or other apparatus. In particular, various general-purpose machines may be used with programs written in accordance with the teachings herein, or it may be more convenient to construct a more specialized apparatus to perform and/or control the required method and processes.

As mentioned, the various stations of an integrated deposition system of the invention may be modular, but once connected, form a continuous system where a controlled ambient environment is established and maintained in order to process substrates at the various stations within the system. FIG. 8C depicts integrated deposition system 800a, which is like system 800, but in this example each of the stations is modular, specifically, an EC layer station 806a, an IC layer station 806b and a CE layer station 806c. Modular form is not necessary, but it is convenient, because depending on the need, an integrated deposition system can be assembled according to custom needs and emerging process advancements. For example, FIG. 8D depicts an integrated deposition system, 800b, with two lithium deposition stations, 807a and 807b. System 800b is, e.g., equipped to carry out methods of the invention as described above, such as the dual lithiation method described in conjunction with FIG. 7C. System 800b could also be used to carry out a single lithiation method, e.g. that described in conjunction with FIG. 7D, for example by only utilizing lithium station 807b during processing of the substrate. But with modular format, e.g. if single lithiation is the desired process, then one of the lithiation stations is redundant and system 800c, as depicted in FIG. 8E can be used. System 800c has only one lithium deposition station, 807.

Systems 800b and 800c also have a TCO layer station, 808, for depositing the TCO layer on the EC stack. Depending on the process demands, additional stations can be added to the integrated deposition system, e.g., stations for cleaning processes, laser scribes, capping layers, MTC, etc.

Although the foregoing invention has been described in some detail to facilitate understanding, the described embodiments are to be considered illustrative and not limiting. It will be apparent to one of ordinary skill in the art that certain changes and modifications can be practiced within the scope of the appended claims.

What is claimed is:

1. An electrochromic device, comprising:
   a first conductive layer;
   a cathodically coloring layer comprising a cathodically coloring electrochromic material; and
   an anodically coloring layer comprising an anodically coloring electrochromic material and one or more additives,
      wherein the anodically coloring electrochromic material comprises at least one metal selected from the group consisting of chromium (Cr), manganese (Mn), iron (Fe), cobalt (Co), nickel (Ni), rhodium (Rh), ruthenium (Ru), vanadium (V), and iridium (Ir), and
      wherein at least one of the one or more additives comprises a material selected from the group consisting of silver (Ag), arsenic (As), gold (Au), cadmium (Cd), cesium (Cs), copper (Cu), europium (Eu), mercury (Hg), osmium (Os), lead (Pb), palladium (Pd), promethium (Pm), polonium (Po), platinum (Pt), radium (Ra), rubidium (Rb), terbium (Tb), technetium (Tc), thorium (Th), thallium (Tl), and combinations thereof; and
   a second conductive layer, wherein the cathodically coloring layer and the anodically coloring layer are positioned between the first and second conductive layers.

2. The electrochromic device of claim 1, wherein the metal in the anodically coloring electrochromic material is in the form of a metal oxide.

3. The electrochromic device of claim 1, wherein the at least one of the one or more additives is a metal oxide.

4. The electrochromic device of claim 1, wherein the electrochromic device is fabricated by depositing the cathodically coloring layer and the anodically coloring layer in direct contact with one another, without an ion conducting layer between the cathodically coloring layer and the anodically coloring layer.

5. The electrochromic device of claim 4, wherein at least one of the cathodically coloring layer and the anodically coloring layer are deposited to include an oxygen-rich portion, the oxygen-rich portion having a higher concentration of oxygen compared to a remaining portion of the cathodically coloring layer or anodically coloring layer, respectively.

6. The electrochromic device of claim 1, wherein the anodically coloring electrochromic material comprises nickel oxide.

7. The electrochromic device of claim 6, wherein the at least one of the one or more additives comprises Ag.

8. The electrochromic device of claim 6, wherein the at least one of the one or more additives comprises As.

9. The electrochromic device of claim 6, wherein the at least one of the one or more additives comprises Au.

10. The electrochromic device of claim 6, wherein the at least one of the one or more additives comprises Cd.

11. The electrochromic device of claim 6, wherein the at least one of the one or more additives comprises Cs.

12. The electrochromic device of claim 6, wherein the at least one of the one or more additives comprises Cu.

13. The electrochromic device of claim 6, wherein the at least one of the one or more additives comprises Eu.

14. The electrochromic device of claim 6, wherein the at least one of the one or more additives comprises Hg.

15. The electrochromic device of claim 6, wherein the at least one of the one or more additives comprises Os.

16. The electrochromic device of claim 6, wherein the at least one of the one or more additives comprises Pb.

17. The electrochromic device of claim 6, wherein the at least one of the one or more additives comprises Pd.

18. The electrochromic device of claim 6, wherein the at least one of the one or more additives comprises Pm.

19. The electrochromic device of claim 6, wherein the at least one of the one or more additives comprises Po.

20. The electrochromic device of claim 6, wherein the at least one of the one or more additives comprises Pt.

21. The electrochromic device of claim 6, wherein the at least one of the one or more additives comprises Ra.

22. The electrochromic device of claim 6, wherein the at least one of the one or more additives comprises Rb.

23. The electrochromic device of claim 6, wherein the at least one of the one or more additives comprises Tb.

24. The electrochromic device of claim 6, wherein the at least one of the one or more additives comprises Tc.

25. The electrochromic device of claim 6, wherein the at least one of the one or more additives comprises Th.

26. The electrochromic device of claim 6, wherein the at least one of the one or more additives comprises Tl.

27. The electrochromic device of claim 1, wherein the cathodically coloring electrochromic material comprises tungsten oxide doped with lithium, sodium, potassium, molybdenum, vanadium, or titanium.

* * * * *